United States Patent
Roy

(10) Patent No.: US 12,222,782 B2
(45) Date of Patent: Feb. 11, 2025

(54) DATA CENTER AIR HANDLING UNIT INCLUDING UNINTERRUPTABLE COOLING FAN WITH WEIGHTED ROTOR AND METHOD OF USING THE SAME

(71) Applicant: Switch, Ltd., Las Vegas, NV (US)

(72) Inventor: Rob Roy, Las Vegas, NV (US)

(73) Assignee: SWITCH, LTD., Las Vegas, NV (US)

( * ) Notice: Subject to any disclaimer, the term of this patent is extended or adjusted under 35 U.S.C. 154(b) by 0 days.

(21) Appl. No.: 17/896,003

(22) Filed: Aug. 25, 2022

(65) Prior Publication Data

US 2022/0413571 A1    Dec. 29, 2022

Related U.S. Application Data

(60) Continuation of application No. 16/588,576, filed on Sep. 30, 2019, now Pat. No. 11,435,793, which is a division of application No. 15/818,596, filed on Nov. 20, 2017, now Pat. No. 11,275,413, which is a continuation of application No. 13/591,150, filed on Aug. 21, 2012, now Pat. No. 9,823,715, which is a continuation-in-part of application No. 12/384,102, filed on Mar. 30, 2009, now Pat. No. 8,469,782,
(Continued)

(51) Int. Cl.
G06F 1/20    (2006.01)
H05K 7/20    (2006.01)

(52) U.S. Cl.
CPC .......... *G06F 1/20* (2013.01); *H05K 7/20172* (2013.01); *H05K 7/20745* (2013.01)

(58) Field of Classification Search
CPC .. G06F 1/20; H05K 7/20172; H05K 7/20745; F24F 1/24
See application file for complete search history.

(56) References Cited

U.S. PATENT DOCUMENTS 1,363,407 A    12/1920    Goudie
2,330,769 A     9/1943    Wichner
(Continued)

FOREIGN PATENT DOCUMENTS

GB    2228024 A        8/1990
JP    H09298863 A  *  11/1997
(Continued)

OTHER PUBLICATIONS

Translation, JP-2005098214-A, Apr. 2005 (Year: 2005).*
(Continued)

*Primary Examiner* — Jessica Yuen
(74) *Attorney, Agent, or Firm* — Dickinson Wright PLLC

(57) ABSTRACT

Described herein is an air handling unit for use in an integrated data center that provides for efficient cooling, wherein the air handling unit includes one or more uninterruptable cooling fans each with a weighted rotor for providing uninterrupted cooling during a power outage until back-up generators come on-line, and a method of using the same. The uninterruptable cooling fan rotors are configured to store sufficient energy as rotational kinetic energy. Furthermore, the uninterruptable cooling fans may also be configured for generation of electricity to power a control system associated therewith during a power outage until back-up generators come on-line.

20 Claims, 23 Drawing Sheets

Related U.S. Application Data which is a continuation-in-part of application No. 12/138,771, filed on Jun. 13, 2008, now Pat. No. 9,788,455.

(60) Provisional application No. 61/040,636, filed on Mar. 28, 2008, provisional application No. 60/944,082, filed on Jun. 14, 2007.

(56) References Cited

U.S. PATENT DOCUMENTS

| | | |
|---|---|---|
| 2,407,217 A | 9/1946 | Banneyer |
| 2,880,949 A | 4/1959 | Fuss |
| 2,891,750 A | 6/1959 | Bergquist |
| 3,192,306 A | 6/1965 | 061965 |
| 3,202,580 A | 8/1965 | 081965 |
| 3,236,122 A | 2/1966 | 021966 |
| 3,513,326 A | 5/1970 | 051970 |
| 3,521,843 A | 7/1970 | Ogle |
| 3,563,882 A | 2/1971 | Kimura et al. |
| 3,670,238 A | 6/1972 | Ronk |
| 3,805,638 A | 4/1974 | Herdzina |
| 3,840,124 A | 10/1974 | Atwater |
| 3,985,957 A | 10/1976 | Torn |
| 4,028,293 A | 6/1977 | Van Den Berg |
| 4,073,099 A | 2/1978 | Van Der et al. |
| 4,102,463 A | 7/1978 | Schmidt |
| 4,118,608 A | 10/1978 | Kussy |
| 4,149,114 A | 4/1979 | Gorjan |
| 4,158,754 A | 6/1979 | Yonezaki et al. |
| 4,171,029 A | 10/1979 | Beale |
| 4,189,990 A | 2/1980 | Kittler |
| 4,233,858 A | 11/1980 | Rowlett |
| 4,258,271 A | 3/1981 | Chappell |
| 4,320,261 A | 3/1982 | Scerbo et al. |
| 4,339,779 A | 7/1982 | Kalbach |
| 4,434,390 A | 2/1984 | Elms |
| 4,453,117 A | 6/1984 | Elms |
| 4,456,867 A | 6/1984 | Mallick et al. |
| 4,461,986 A | 7/1984 | Maynard et al. |
| 4,467,260 A | 8/1984 | Mallick |
| 4,472,920 A | 9/1984 | Simpson |
| 4,476,423 A | 10/1984 | Mallick |
| 4,528,789 A | 7/1985 | Simpson |
| 4,548,164 A | 10/1985 | Ylonen et al. |
| 4,602,468 A | 7/1986 | Simpson |
| 4,620,397 A | 11/1986 | Simpson et al. |
| 4,663,911 A | 5/1987 | Gracia |
| 4,797,783 A | 1/1989 | Kohmoto |
| 4,996,909 A | 3/1991 | Vache et al. |
| 5,003,867 A | 4/1991 | Sodec et al. |
| 5,005,323 A | 4/1991 | Simpson et al. |
| 5,065,060 A | 11/1991 | Takahashi |
| 5,142,838 A | 9/1992 | Simpson |
| 5,237,484 A | 8/1993 | Ferchau |
| 5,271,585 A | 12/1993 | Zetena |
| 5,312,296 A | 5/1994 | Aalto et al. |
| 5,322,646 A | 6/1994 | Wright et al. |
| 5,438,781 A | 8/1995 | Landmann |
| 5,473,114 A | 12/1995 | Vogel |
| 5,544,012 A | 8/1996 | Koike |
| 5,545,086 A | 8/1996 | Sharp |
| 5,570,740 A | 11/1996 | Flores et al. |
| 5,600,924 A | 2/1997 | Forsberg |
| 5,646,458 A | 7/1997 | Bowyer |
| 5,657,641 A | 8/1997 | Cunningham et al. |
| 5,704,170 A | 1/1998 | Simpson |
| 5,743,063 A | 4/1998 | Boozer |
| 5,769,365 A | 6/1998 | Onishi |
| 5,784,847 A | 7/1998 | Wiklund |
| 5,852,904 A | 12/1998 | Yu et al. |
| 5,857,292 A | 1/1999 | Simpson |
| 5,875,592 A | 3/1999 | Allman et al. |
| 5,880,544 A | 3/1999 | Ikeda |
| 5,885,154 A | 3/1999 | Napadow et al. |
| 5,941,767 A | 8/1999 | Fukuda et al. |
| 5,969,292 A | 10/1999 | Snider et al. |
| 6,034,873 A | 3/2000 | Stahl et al. |
| 6,079,941 A | 6/2000 | Lee |
| 6,129,316 A | 10/2000 | Bauer |
| 6,150,736 A | 11/2000 | Brill |
| 6,204,572 B1 | 3/2001 | Liran |
| 6,224,016 B1 | 5/2001 | Lee et al. |
| 6,231,704 B1 | 5/2001 | Carpinetti |
| 6,239,513 B1 | 5/2001 | Dean |
| 6,301,853 B1 | 10/2001 | Simpson et al. |
| 6,365,830 B1 | 4/2002 | Snider, Jr. |
| 6,374,627 B1 | 4/2002 | Schumacher |
| 6,394,398 B1 | 5/2002 | Reed |
| 6,407,533 B1 | 6/2002 | Bartek et al. |
| 6,412,260 B1 | 7/2002 | Lukac |
| 6,412,292 B2 | 7/2002 | Spinazzola et al. |
| 6,427,454 B1 | 8/2002 | West |
| 6,437,243 B1 | 8/2002 | VanderVelde |
| 6,453,055 B1 | 9/2002 | Fukumura et al. |
| 6,474,274 B2 | 11/2002 | Lehman |
| 6,481,527 B1 | 11/2002 | French et al. |
| 6,506,110 B1 | 1/2003 | Borisch |
| 6,515,224 B1 | 2/2003 | Pedro |
| 6,535,382 B2 | 3/2003 | Bishop et al. |
| 6,541,704 B1 | 4/2003 | Levenson et al. |
| 6,566,775 B1 | 5/2003 | Fradella |
| 6,567,769 B2 | 5/2003 | Chang |
| 6,573,626 B1 | 6/2003 | Gosebruch |
| 6,574,970 B2 | 6/2003 | Spinazzola et al. |
| 6,592,448 B1 | 7/2003 | Williams |
| 6,616,524 B2 | 9/2003 | Storck et al. |
| 6,657,320 B1 | 12/2003 | Andrews |
| 6,672,955 B2 | 1/2004 | Charron |
| 6,707,688 B2 | 3/2004 | Reyes et al. |
| 6,722,151 B2 | 4/2004 | Spinazzola et al. |
| 6,742,942 B2 | 6/2004 | Hering et al. |
| 6,745,579 B2 | 6/2004 | Spinazzola et al. |
| 6,794,777 B1 | 9/2004 | Fradella |
| 6,817,688 B2 | 11/2004 | O'Halloran |
| 6,822,859 B2 | 11/2004 | Coglitore et al. |
| 6,824,150 B2 | 11/2004 | Simione |
| 6,833,991 B2 | 12/2004 | Van Gaal |
| 6,846,132 B2 | 1/2005 | Kennedy et al. |
| 6,848,267 B2 | 2/2005 | Pierson |
| 6,859,366 B2 | 2/2005 | Fink et al. |
| 6,862,179 B2 | 3/2005 | Beitelmal et al. |
| 6,867,967 B2 | 3/2005 | Mok |
| 6,897,575 B1 | 5/2005 | Yu |
| 6,897,587 B1 | 5/2005 | McMullen |
| 6,957,670 B1 | 10/2005 | Kajino |
| 6,967,283 B2 | 11/2005 | Rasmussen et al. |
| 6,980,433 B2 | 12/2005 | Fink et al. |
| 6,981,915 B2 | 1/2006 | Moore et al. |
| 7,003,374 B2 | 2/2006 | Olin et al. |
| 7,033,267 B2 | 4/2006 | Rasmussen et al. |
| 7,042,722 B2 | 5/2006 | Suzuki et al. |
| 7,061,715 B2 | 6/2006 | Miyamoto |
| 7,085,133 B2 | 8/2006 | Hall |
| 7,100,827 B2 | 9/2006 | Olin et al. |
| 7,128,138 B2 | 10/2006 | Des Champs |
| 7,187,265 B1 | 3/2007 | Senogles et al. |
| 7,232,236 B2 | 6/2007 | Vitense et al. |
| 7,278,273 B1 | 10/2007 | Whitted |
| 7,315,448 B1 | 1/2008 | Bash et al. |
| 7,348,702 B2 * | 3/2008 | Melfi .................. H02K 7/02 |
| | | 322/26 |
| 7,369,741 B2 | 5/2008 | Reagan et al. |
| 7,372,695 B2 | 5/2008 | Coglitore |
| 7,430,118 B1 | 9/2008 | Noteboom et al. |
| 7,448,945 B2 | 11/2008 | Bessent |
| 7,462,954 B2 | 12/2008 | Kraus |
| 7,477,514 B2 | 1/2009 | Campbell et al. |
| 7,486,511 B1 | 2/2009 | Griffel et al. |
| 7,500,911 B2 | 3/2009 | Johnson et al. |
| 7,505,849 B2 | 3/2009 | Saarikivi |
| 7,508,663 B2 | 3/2009 | Coglitore et al. |
| 7,511,959 B2 | 3/2009 | Belady |
| 7,542,287 B2 | 6/2009 | Lewis et al. |

(56) References Cited

U.S. PATENT DOCUMENTS

| | | |
|---|---|---|
| 7,568,360 B1 | 8/2009 | Bash et al. |
| 7,574,839 B1 | 8/2009 | Simpson |
| 7,601,922 B2 | 10/2009 | Larsen et al. |
| 7,604,535 B2 | 10/2009 | Germagian et al. |
| 7,641,546 B2 | 1/2010 | Bok et al. |
| 7,643,291 B2 | 1/2010 | Mallia et al. |
| 7,656,660 B2 | 2/2010 | Hoeft |
| 7,667,965 B2 | 2/2010 | Nobile |
| 7,675,747 B1 | 3/2010 | Ong et al. |
| 7,684,193 B2 | 3/2010 | Fink et al. |
| 7,688,578 B2 | 3/2010 | Mann et al. |
| 7,716,829 B2 | 5/2010 | Des Champs et al. |
| 7,750,518 B1 | 7/2010 | Perkins |
| 7,778,030 B1 | 8/2010 | Chiriac |
| 7,787,260 B2 | 8/2010 | Hruby et al. |
| 7,789,359 B2 | 9/2010 | Chopp, Jr et al. |
| 7,804,685 B2 | 9/2010 | Krietzman et al. |
| 7,804,690 B2 | 9/2010 | Huang et al. |
| 7,841,199 B2 | 11/2010 | VanGilder et al. |
| 7,862,410 B2 | 1/2011 | McMahan et al. |
| 7,881,310 B2 | 2/2011 | Kandlur et al. |
| 7,894,190 B2 | 2/2011 | Davis et al. |
| 7,903,407 B2 | 3/2011 | Matsushima et al. |
| 7,944,692 B2 | 5/2011 | Grantham et al. |
| 7,954,070 B2 | 5/2011 | Plocher et al. |
| 7,957,139 B2 | 6/2011 | Davis et al. |
| 7,971,446 B2 | 7/2011 | Clidaras |
| 8,040,673 B2 | 10/2011 | Krietzman |
| 8,061,087 B2 | 11/2011 | Ray |
| 8,072,780 B1 | 12/2011 | Roy |
| 8,113,010 B2 | 2/2012 | Carlson |
| 8,144,467 B2 | 3/2012 | Campbell et al. |
| 8,159,820 B2 | 4/2012 | Ibori et al. |
| 8,180,495 B1 | 5/2012 | Roy |
| 8,209,056 B2 | 6/2012 | Rasmussen et al. |
| 8,209,993 B2 | 7/2012 | Carlson et al. |
| 8,223,495 B1 | 7/2012 | Carlson et al. |
| 8,257,155 B2 | 9/2012 | Lewis |
| 8,276,397 B1 | 10/2012 | Carlson et al. |
| 8,282,451 B2 | 10/2012 | Taylor |
| 8,300,410 B2 | 10/2012 | Slessman |
| 8,310,832 B2 | 11/2012 | Vanderveen et al. |
| 8,346,398 B2 | 1/2013 | Ahmed et al. |
| 8,395,891 B2 | 3/2013 | Noteboom et al. |
| 8,469,782 B1 | 6/2013 | Roy |
| 8,493,732 B2 | 7/2013 | Lineal et al. |
| 8,498,114 B2 | 7/2013 | Martini |
| 8,509,960 B2 | 8/2013 | Tai et al. |
| 8,514,572 B2 | 8/2013 | Rogers |
| 8,523,643 B1 | 9/2013 | Roy |
| 8,544,575 B1 | 10/2013 | Scaringe |
| 8,553,409 B2 | 10/2013 | Rehmann et al. |
| 8,574,046 B2 | 11/2013 | Nishiyama et al. |
| 8,583,290 B2 | 11/2013 | Campbell et al. |
| 8,601,827 B2 | 12/2013 | Keisling et al. |
| 8,636,565 B2 | 1/2014 | Carlson et al. |
| 8,671,686 B2 | 3/2014 | Pinkerton |
| 8,705,233 B2 | 4/2014 | Rehmann et al. |
| 8,782,234 B2 | 7/2014 | Pienta et al. |
| 8,806,238 B2 | 8/2014 | Jau |
| 8,824,142 B2 | 9/2014 | Jewell |
| 8,853,872 B2 | 10/2014 | Clidaras et al. |
| 9,021,821 B2 | 5/2015 | Dunnavant |
| 9,032,742 B2 | 5/2015 | Dunnavant |
| 9,055,696 B2 | 6/2015 | Dunnavant |
| 9,081,538 B1 | 7/2015 | Roy |
| 9,104,387 B1 | 8/2015 | Eichelberg |
| 9,119,326 B2 | 8/2015 | McDonnell et al. |
| 9,121,618 B2 | 9/2015 | Fisher et al. |
| 9,198,331 B2 | 11/2015 | Roy |
| 9,204,578 B2 | 12/2015 | Smith |
| 9,282,684 B2 | 3/2016 | Keisling et al. |
| 9,301,432 B2 | 3/2016 | Nelson et al. |
| 9,313,927 B2 | 4/2016 | Krietzman |
| 9,363,925 B2 | 6/2016 | Czamara |
| 9,464,634 B2 | 10/2016 | David |
| 9,560,777 B2 | 1/2017 | Krietzman et al. |
| 9,568,011 B2 | 2/2017 | Dvid |
| 9,591,790 B2 | 3/2017 | Eichelberg |
| 9,606,588 B2 | 3/2017 | Dean et al. |
| 9,622,389 B1 | 4/2017 | Roy |
| 9,629,285 B2 | 4/2017 | Lachapelle et al. |
| 9,648,784 B2 | 5/2017 | Keisling et al. |
| 9,693,486 B1 | 6/2017 | Roy |
| 9,823,715 B1 | 11/2017 | Roy |
| 9,867,318 B2 | 1/2018 | Eichelberg |
| 9,877,414 B2 | 1/2018 | Vorreiter |
| 9,899,752 B2 | 2/2018 | Wu |
| 9,951,785 B2 | 4/2018 | David |
| 10,028,415 B1 | 7/2018 | Roy |
| 10,539,993 B2 | 1/2020 | Goodward |
| 11,275,413 B2 * | 3/2022 | Roy .................. H05K 7/20745 |
| 11,435,793 B2 * | 9/2022 | Roy .................. H05K 7/20745 |
| 2001/0029163 A1 | 10/2001 | Spinazzola et al. |
| 2002/0005457 A1 | 1/2002 | Lee et al. |
| 2002/0059804 A1 | 5/2002 | Spinazzola et al. |
| 2002/0073941 A1 | 6/2002 | Lehman |
| 2002/0108386 A1 | 8/2002 | Spinazzola et al. |
| 2002/0121555 A1 | 9/2002 | Cipolla et al. |
| 2002/0134567 A1 | 9/2002 | Rasmussen et al. |
| 2003/0050003 A1 | 3/2003 | Charron |
| 2003/0066638 A1 | 4/2003 | Qu |
| 2003/0122379 A1 | 7/2003 | Woods |
| 2003/0124971 A1 | 7/2003 | Williams |
| 2003/0143942 A1 | 7/2003 | Kennedy et al. |
| 2003/0181158 A1 | 9/2003 | Schell et al. |
| 2003/0183955 A1 | 10/2003 | Fields |
| 2003/0209023 A1 | 11/2003 | Spinazzola et al. |
| 2003/0231881 A1 | 12/2003 | Hering et al. |
| 2004/0004813 A1 | 1/2004 | Coglitore |
| 2004/0050231 A1 | 3/2004 | Chu |
| 2004/0099747 A1 | 5/2004 | Johnson et al. |
| 2004/0118137 A1 | 6/2004 | Patel |
| 2004/0148934 A1 | 8/2004 | Pinkerton |
| 2004/0218355 A1 | 11/2004 | Bash et al. |
| 2005/0024826 A1 | 2/2005 | Bash |
| 2005/0034468 A1 | 2/2005 | Dietz |
| 2005/0099770 A1 | 5/2005 | Fink |
| 2005/0167135 A1 | 8/2005 | Jackson |
| 2005/0170770 A1 | 8/2005 | Johnson et al. |
| 2005/0173925 A1 | 8/2005 | Farkas |
| 2005/0185363 A1 | 8/2005 | Rasmussen et al. |
| 2005/0225936 A1 | 10/2005 | Day |
| 2005/0245132 A1 | 11/2005 | Huang et al. |
| 2005/0246057 A1 | 11/2005 | Olin et al. |
| 2005/0278070 A1 | 12/2005 | Bash et al. |
| 2006/0021786 A1 | 2/2006 | Fetterolf et al. |
| 2006/0026954 A1 | 2/2006 | Truong |
| 2006/0055175 A1 | 3/2006 | Grinblat |
| 2006/0056127 A1 | 3/2006 | Lewis |
| 2006/0059936 A1 | 3/2006 | Radke |
| 2006/0066104 A1 | 3/2006 | Melfi |
| 2006/0066163 A1 | 3/2006 | Melfi |
| 2006/0072277 A1 | 4/2006 | Schmidt et al. |
| 2006/0082263 A1 | 4/2006 | Rimler et al. |
| 2006/0146520 A1 | 7/2006 | Vitense et al. |
| 2006/0158037 A1 | 7/2006 | Danley |
| 2006/0185931 A1 | 8/2006 | Kawar |
| 2006/0187636 A1 | 8/2006 | Fink et al. |
| 2006/0236487 A1 | 10/2006 | Dean |
| 2006/0260338 A1 | 11/2006 | Van Gilder et al. |
| 2006/0276121 A1 | 12/2006 | Rasmussen et al. |
| 2006/0277501 A1 | 12/2006 | Plocher et al. |
| 2006/0281061 A1 | 12/2006 | Hightower |
| 2007/0021050 A1 | 1/2007 | Kennedy |
| 2007/0032979 A1 | 2/2007 | Hamann et al. |
| 2007/0040263 A1 | 2/2007 | Towada |
| 2007/0064389 A1 | 3/2007 | Lewis, II et al. |
| 2007/0078635 A1 | 4/2007 | Rasmussen et al. |
| 2007/0082195 A1 | 4/2007 | Goecke et al. |
| 2007/0094946 A1 | 5/2007 | Schoeny |
| 2007/0105445 A1 | 5/2007 | Manto et al. |
| 2007/0129000 A1 | 6/2007 | Rasmussen et al. |
| 2007/0135032 A1 | 6/2007 | Wang |

(56) References Cited

U.S. PATENT DOCUMENTS

| | | |
|---|---|---|
| 2007/0146994 A1 | 6/2007 | Germagian |
| 2007/0171613 A1 | 7/2007 | McMahan et al. |
| 2007/0211443 A1 | 9/2007 | Wechter et al. |
| 2007/0213000 A1 | 9/2007 | Day |
| 2007/0243425 A1 | 10/2007 | Spaner |
| 2007/0253181 A1 | 11/2007 | Bersiek |
| 2007/0267247 A1 | 11/2007 | Tartsch |
| 2007/0274043 A1 | 11/2007 | Shabany |
| 2008/0029250 A1 | 2/2008 | Carlson et al. |
| 2008/0035810 A1 | 2/2008 | Lewis |
| 2008/0055848 A1 | 3/2008 | Hamburgen et al. |
| 2008/0055850 A1 | 3/2008 | Carlson et al. |
| 2008/0094797 A1 | 4/2008 | Coglitore |
| 2008/0137266 A1 | 6/2008 | Jensen |
| 2008/0264688 A1 | 10/2008 | Chopp et al. |
| 2008/0299890 A1 | 12/2008 | Orrell |
| 2008/0305733 A1 | 12/2008 | Noteboom et al. |
| 2009/0051545 A1 | 2/2009 | Koblasz |
| 2009/0061756 A1 | 3/2009 | Germagian et al. |
| 2009/0064551 A1 | 3/2009 | Schroder et al. |
| 2009/0168345 A1 | 7/2009 | Martini |
| 2009/0195977 A1 | 8/2009 | Fink et al. |
| 2009/0197684 A1 | 8/2009 | Arezina et al. |
| 2009/0228726 A1 | 9/2009 | Malik |
| 2009/0229510 A1 | 9/2009 | Sutter |
| 2009/0235097 A1 | 9/2009 | Hamilton |
| 2009/0239460 A1 | 9/2009 | Lucia et al. |
| 2009/0239461 A1 | 9/2009 | Lewis et al. |
| 2009/0241578 A1 | 10/2009 | Carlson |
| 2009/0277605 A1 | 11/2009 | Vangilder et al. |
| 2009/0308579 A1 | 12/2009 | Johnson et al. |
| 2009/0319650 A1 | 12/2009 | Collins |
| 2009/0326721 A1 | 12/2009 | Sugiyama |
| 2010/0003911 A1 | 1/2010 | Graczyk et al. |
| 2010/0016730 A1 | 1/2010 | Tanaka et al. |
| 2010/0048119 A1 | 2/2010 | Tashiro |
| 2010/0061057 A1 | 3/2010 | Dersch |
| 2010/0061059 A1 | 3/2010 | Krietzman et al. |
| 2010/0110626 A1 | 5/2010 | Schmitt et al. |
| 2010/0136895 A1 | 6/2010 | Sgro |
| 2010/0139887 A1 | 6/2010 | Slessman |
| 2010/0144265 A1 | 6/2010 | Bednarcik et al. |
| 2010/0151781 A1 | 6/2010 | Slessman et al. |
| 2010/0154448 A1 | 6/2010 | Hay |
| 2010/0165565 A1 | 7/2010 | Hellriegal et al. |
| 2010/0165572 A1 | 7/2010 | Fink |
| 2010/0170277 A1 | 7/2010 | Schmitt et al. |
| 2010/0187832 A1 | 7/2010 | Holland |
| 2010/0190430 A1 | 7/2010 | Rodriguez et al. |
| 2010/0201230 A1 | 8/2010 | Schweitzer et al. |
| 2010/0216388 A1 | 8/2010 | Tresh et al. |
| 2010/0223085 A1 | 9/2010 | Gauthier et al. |
| 2010/0223800 A1 | 9/2010 | Morrison et al. |
| 2010/0245083 A1 | 9/2010 | Lewis |
| 2010/0248609 A1 | 9/2010 | Tresh et al. |
| 2010/0248610 A1 | 9/2010 | Caveney et al. |
| 2010/0267325 A1 | 10/2010 | Matser et al. |
| 2010/0269786 A1 | 10/2010 | Shimamura |
| 2010/0304657 A1 | 12/2010 | Gallmann et al. |
| 2010/0314849 A1 | 12/2010 | Realegeno-Amaya |
| 2010/0328889 A1 | 12/2010 | Campbell et al. |
| 2011/0009047 A1 | 1/2011 | Noteboom et al. |
| 2011/0014862 A1 | 1/2011 | Honold et al. |
| 2011/0031071 A1 | 2/2011 | Takeuchi |
| 2011/0078480 A1 | 3/2011 | Calo et al. |
| 2011/0094978 A1 | 4/2011 | Bailey et al. |
| 2011/0105010 A1 | 5/2011 | Day |
| 2011/0122570 A1 | 5/2011 | Beck et al. |
| 2011/0143644 A1 | 6/2011 | McMahan et al. |
| 2011/0156480 A1 | 6/2011 | Park |
| 2011/0157829 A1 | 6/2011 | Wormsbecher et al. |
| 2011/0189936 A1 | 8/2011 | Haspers et al. |
| 2011/0195652 A1 | 8/2011 | Smith |
| 2011/0215645 A1 | 9/2011 | Schomburg |
| 2011/0232209 A1 | 9/2011 | Boersema |
| 2011/0239679 A1 | 10/2011 | Dechene et al. |
| 2011/0239681 A1 | 10/2011 | Ziegler |
| 2011/0239683 A1 | 10/2011 | Czamara et al. |
| 2011/0306288 A1 | 12/2011 | Murayama |
| 2012/0012283 A1 | 1/2012 | Bean, Jr. |
| 2012/0014060 A1 | 1/2012 | Slessman |
| 2012/0014061 A1 | 1/2012 | Slessman |
| 2012/0018966 A1 | 1/2012 | Moore et al. |
| 2012/0031585 A1 | 2/2012 | Salpeter |
| 2012/0041569 A1 | 2/2012 | Zhang |
| 2012/0147552 A1 | 6/2012 | Driggers |
| 2012/0167600 A1 | 7/2012 | Dunnavant |
| 2012/0229972 A1 | 9/2012 | Bean, Jr. |
| 2012/0255710 A1 | 10/2012 | Maselli |
| 2012/0276834 A1 | 11/2012 | Peng et al. |
| 2012/0281357 A1 | 11/2012 | Peng et al. |
| 2012/0297807 A1 | 11/2012 | Canney et al. |
| 2012/0300391 A1 | 11/2012 | Keisling |
| 2012/0300398 A1 | 11/2012 | Eckberg et al. |
| 2012/0327592 A1 | 12/2012 | Godrich et al. |
| 2012/0331317 A1 | 12/2012 | Rogers |
| 2013/0007515 A1 | 1/2013 | Shaw |
| 2013/0049473 A1 | 2/2013 | Brech |
| 2013/0148291 A1 | 6/2013 | Slessman |
| 2013/0340361 A1 | 12/2013 | Rogers |
| 2014/0083656 A1 | 3/2014 | Kaler |
| 2014/0137491 A1 | 5/2014 | Somani et al. |
| 2016/0084257 A1 | 3/2016 | David |
| 2016/0088764 A1 | 3/2016 | David |
| 2016/0360650 A1 | 12/2016 | David |
| 2019/0245352 A1 | 8/2019 | Roy |
| 2019/0289751 A1 | 9/2019 | Roy |

FOREIGN PATENT DOCUMENTS

| | | |
|---|---|---|
| JP | 2005098214 A * | 4/2005 |
| WO | WO02052107 | 7/2002 |

OTHER PUBLICATIONS

Translation, JP-H09298863-A, Nov. 1997, Mimori et al. (Year: 1997).*

International Search Report issued Aug. 7, 2014 in corresponding PCT/US14/30716.

Intel, publication date, if any, unknown, "Air-Cooled High-Performance Data Centers: Case Studies and Best Methods", white paper, dated Nov. 2006, pp. 1-20.

Complaint, "Switch v. Aligned Data Centers", 2017, U.S District Court for the Eastern District of Texas, Marshall Division (Civil Action No. 2:17-CV-574-JRG). Litigation concerning U.S. Pat. No. 9,622,389 with invalidity allegation based on U.S. Pat. No. 8,636,565 (US2008/0055850).

Proffitt, M. "Rack-Level Power and Cooling Designs: Staying Ahead of the Curve", Jan. 2003, ECN Magazine p. 33.

Beaty, D. "Cooling Data Centers with Raised-Floor Plenums", Sep. 2005, HPAC Engineering pp. 58-65.

Fink, J. "Impact of High Density Hot Aisles on IT Personnel Work Conditions", 2005, APC White Paper #123 pp. 1-15.

Dunlap, K. "Maximizing Data Center Cooling—Auditing and understanding data center cooling performance", Jan. 2005, Energy User News pp. 10, 12.

Dunlap et al., The Advantages of Row and Rack-Oriented Cooling Architectures for Data Centers, 2006, APC White Paper #130 pp. 1-21.

Greenberg et al., "Best Practices for Data Centers: Lessons Learned from Benchmarking 22 Data Centers", 2006, ACEEE Summer Study on Energy Efficiency in Buildings pp. 376-387.

Rasmussen, N. "Cooling Strategies for Ultra-High Density Racks and Blade Servers", 2006, APC White Paper #46 (Revision 5) pp. 1-22.

Hannaford, P. "Ten Cooling Solutions to Support High-Density Server Deployment", 2006, APC White Paper #42 (Revision 2) pp. 1-16.

(56) References Cited

OTHER PUBLICATIONS

Domich, K. "Data-center power and cooling strategies", May 2007, Infostor pp. 32-33.

\* cited by examiner

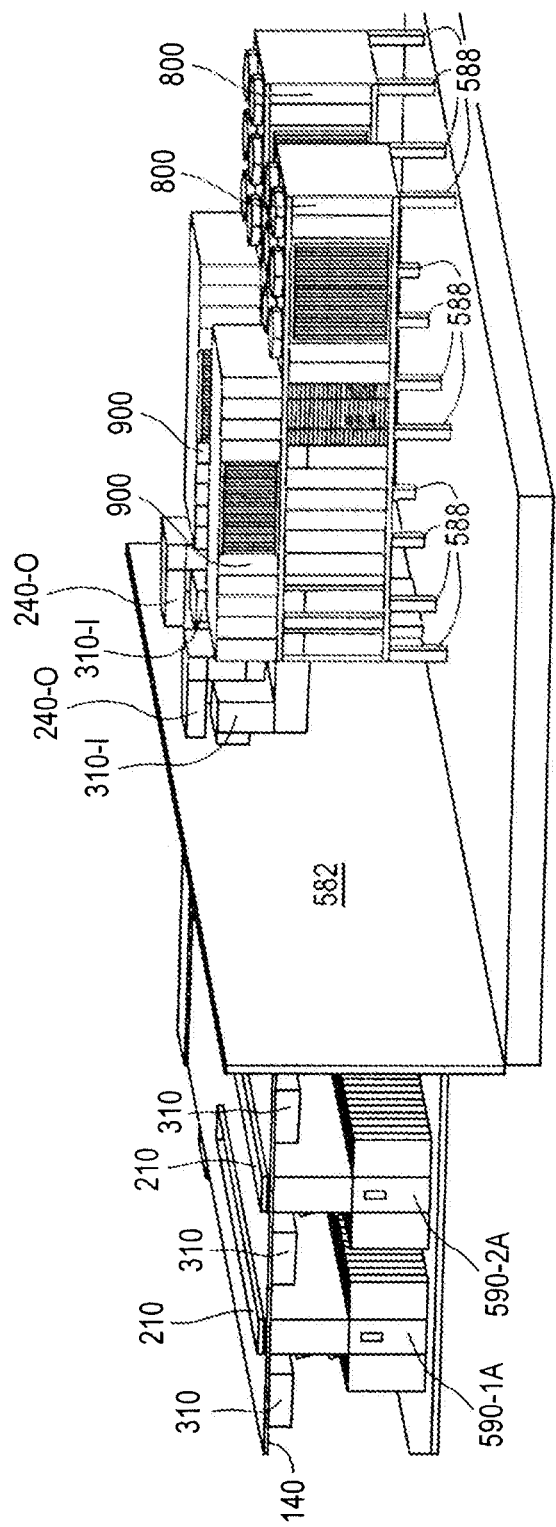
FIG. 5B1

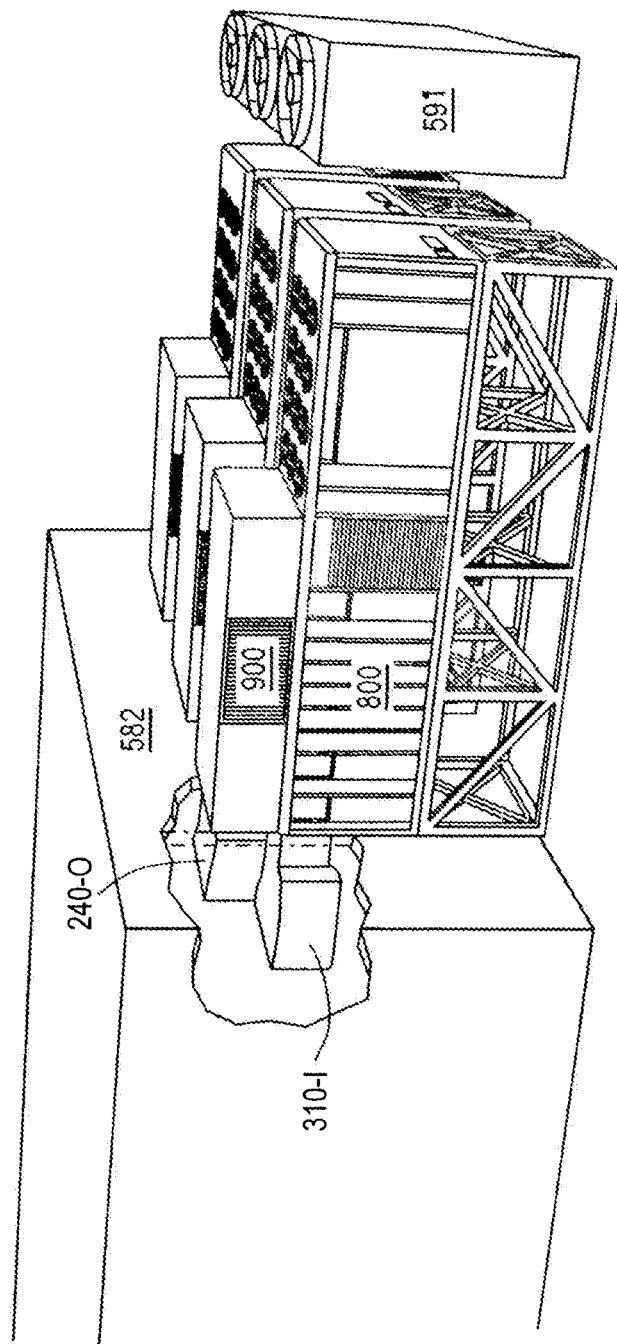
FIG. 5B2

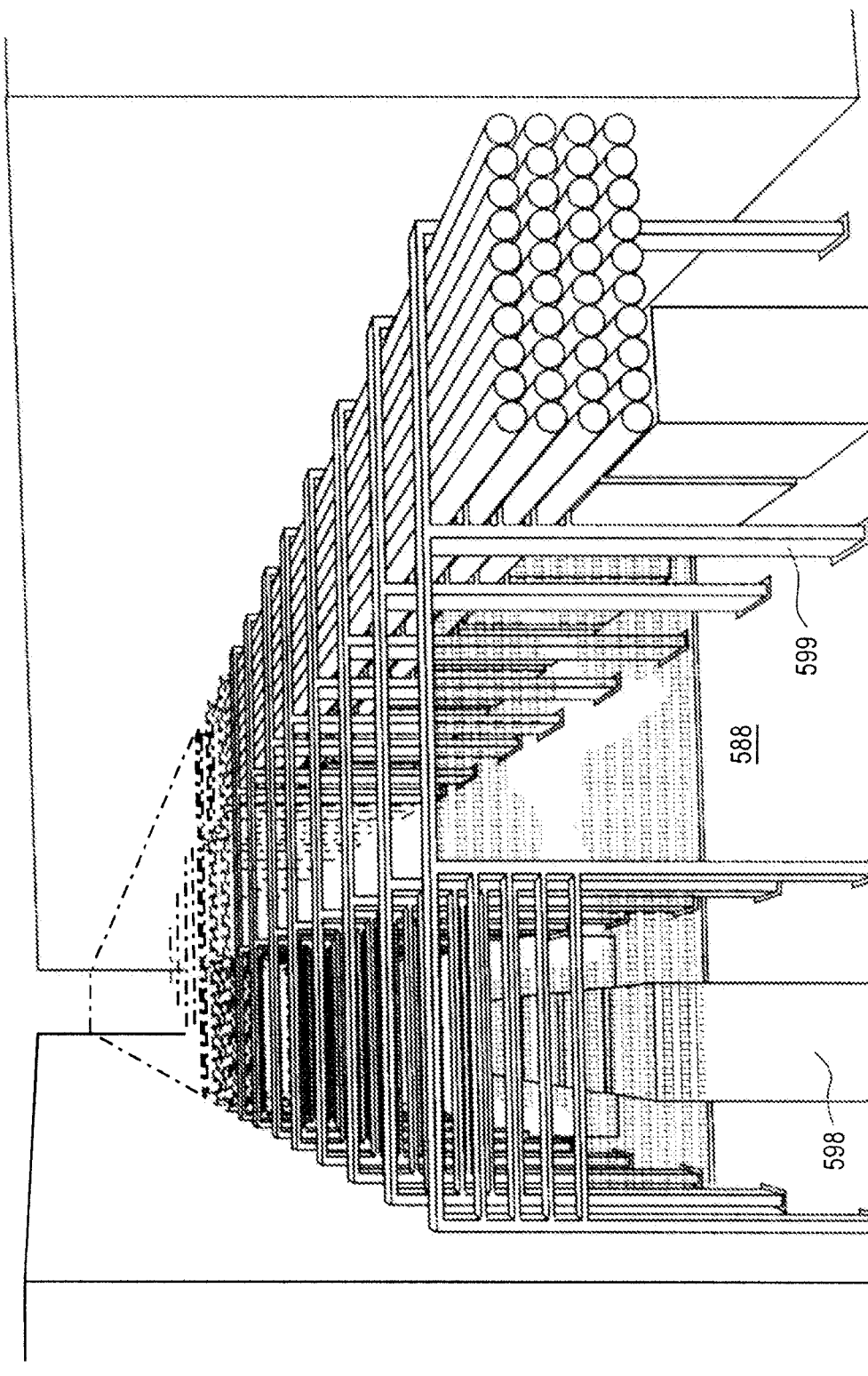

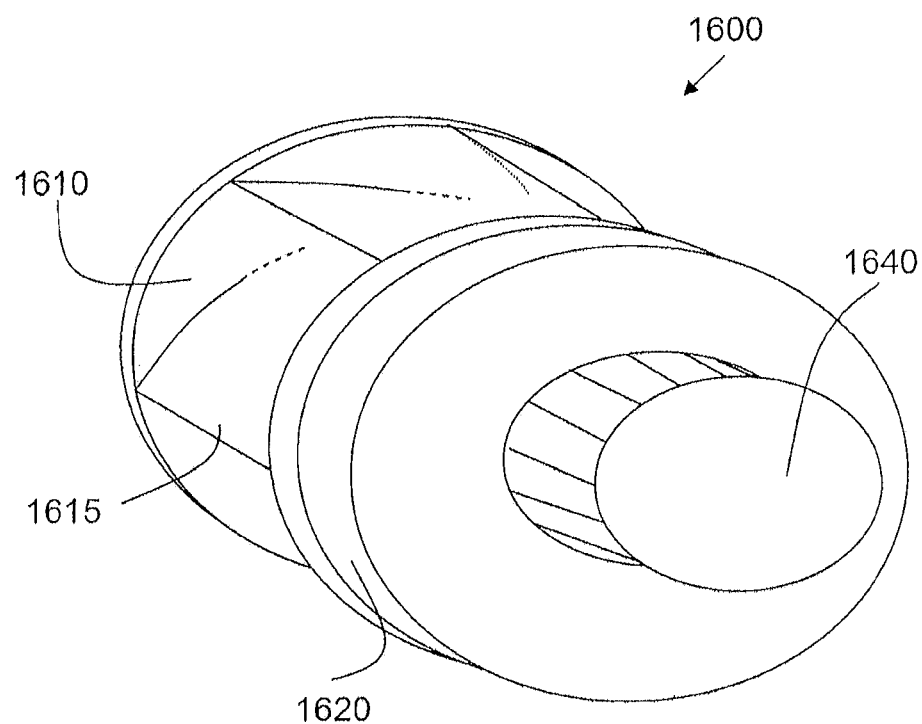
FIG. 11A
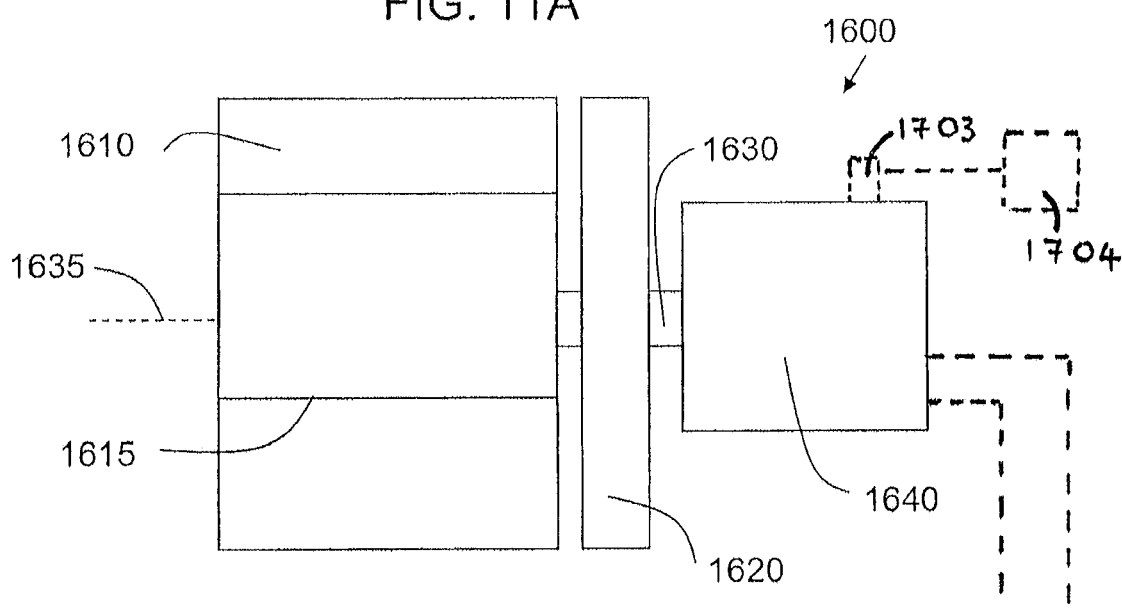
FIG. 11B
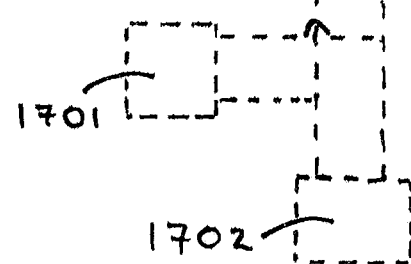

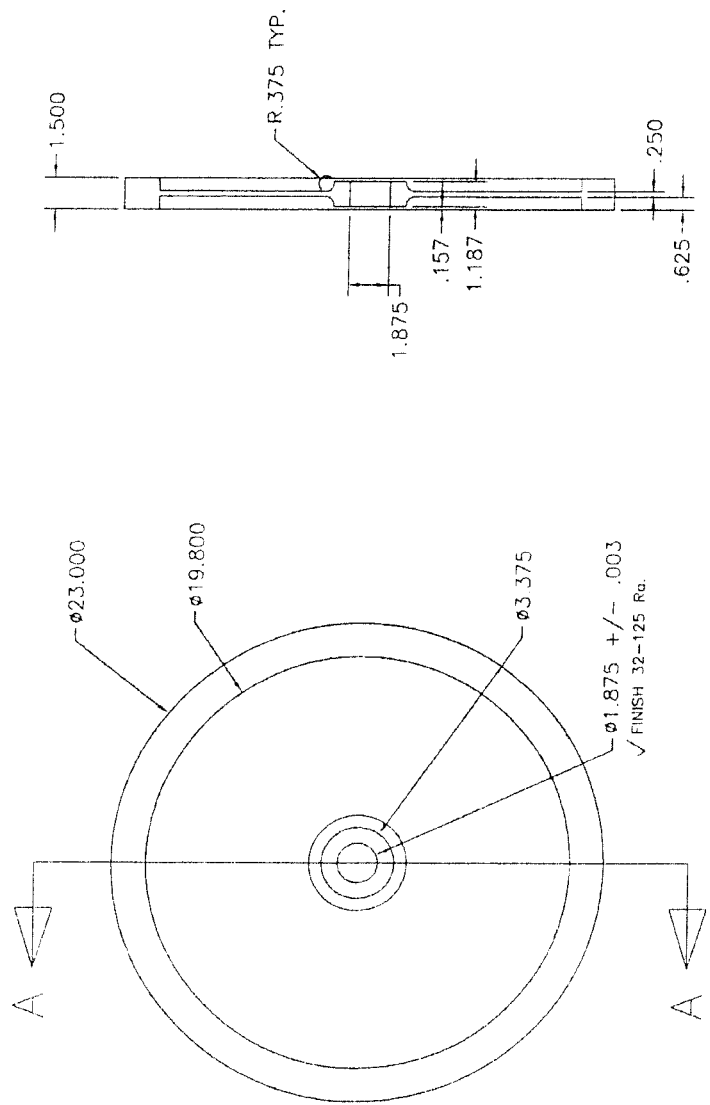

DATA CENTER AIR HANDLING UNIT INCLUDING UNINTERRUPTABLE COOLING FAN WITH WEIGHTED ROTOR AND METHOD OF USING THE SAME

1. FIELD OF THE RELATED ART

The embodiments described herein relate to electronic equipment data center or co-location facility designs and methods of making and using the same in an environmentally aware manner. In particular is described a data center air handling unit including an uninterruptable cooling fan with weighted rotor and method of using the same.

2. BACKGROUND

Data centers and server co-location facilities are well-known. In such facilities, rows of electronics equipment, such as servers, typically owned by different entities, are stored. In many facilities, cabinets are used in which different electronics equipment is stored, so that only the owners of that equipment, and potentially the facility operator, have access therein. In many instances, the owner of the facilities manages the installation and removal of servers within the facility and is responsible for maintaining utility services that are needed for the servers to operate properly. These utility services typically include providing electrical power for operation of the servers, providing telecommunications ports that allow the servers to connect to transmission grids that are typically owned by telecommunication carriers, and providing air-conditioning services that maintain temperatures in the facility at sufficiently low levels for reliable operation.

There are some well-known common aspects to the designs of these facilities. For example, it is known to have the electronic equipment placed into rows, and further to have parallel rows of equipment configured back-to back so that each row of equipment generally forces the heat from the electronic equipment toward a similar area, known as a hot aisle, as that aisle generally contains warmer air that results from the forced heat from the electronics equipment. In the front of the equipment is thus established a cold aisle.

There are different systems for attempting to collect hot air that results from the electronics equipment, cooling that hot air, and then introducing cool air to the electronics equipment. These air-conditioning systems also must co-exist with power and communications wiring for the electronics equipment. Systems in which the electronics equipment is raised above the floor are well-known, as installing the communications wiring from below the electronics equipment has been perceived to offer certain advantages. Routing wiring without raised floors is also known—though not with systematic separation of power and data as described herein.

In the air conditioning units that are used in conventional facility systems, there are both an evaporator unit and a condenser unit. The evaporator units are typically located inside a facility and the condenser units are typically disposed outside of the facility. These units, however, are not located in standardized, accessible, and relatively convenient positions relative to the facility should any of the units need to be accessed and/or removed for repair or replacement. Further, these units are not themselves created using an intentionally transportable design.

In case of power outage, it is important to be able to continue cooling data centers, and back-up generators are provided for this purpose. However, there is typically a period of approximately 15 seconds between the power going down and the back-up generators coming online. To provide continuous power to critical components of the data center, such as the air handling system, during this time period uninterruptable power supplies are used. These uninterruptible power supplies are on-site at the data center. However, providing the uninterruptible power supplies for a data center is very expensive, since not only are the power supplies expensive, but valuable floor space is required within the data center. There is a need for less expensive solutions for keeping the air handling system running during the time period between power going down and the back-up generators coming online.

SUMMARY

Described herein is an air handling unit for use in an integrated data center that provides for efficient cooling, wherein the air handling unit includes one or more uninterruptable cooling fans each with a weighted rotor for providing uninterrupted cooling during a power outage until back-up generators come on-line, and a method of using the same. The uninterruptable cooling fan rotors are configured to store sufficient energy as rotational kinetic energy. Furthermore, the uninterruptable cooling fans may also be configured for generation of electricity to power a control system associated therewith during a power outage until back-up generators come on-line.

In one aspect is provided a method of preventing damage to electrical equipment, the electrical equipment being cooled with cool air from an electrically powered air conditioning unit during normal operation using grid power, the method comprising the steps of rotating a fan to a predetermined RPM using an electric motor powered with electricity from the grid power to cause at least a predetermined airflow, the fan including a weighted rotor assembly that includes a fan body and a plurality of fan blades, wherein the weighted rotor assembly weighs at least 50 pounds to create stored angular kinetic energy; directing the airflow to the electrical equipment; upon removal of the grid power to the fan, continuing to direct continued airflow to the electrical equipment for at least an interim period using the stored angular kinetic energy within the weighted fan rotor; and before expiration of the interim period, continuing to rotate the fan using the electric motor powered with electricity from the back-up generator to cause a predetermined further continued airflow over the electrical equipment.

In another aspect is provided an air conditioning apparatus that receives heated air and emits cooled air into a cabinet cluster containing electronic equipment with equipment fan modules therein and is powered by one of grid power and a back-up generator, the air conditioning apparatus including: a heat exchange unit containing an exhaust fan that emits heat from the heated air as the vented air, thereby allowing return air to pass through a return damper; an outside air inlet that allows outside air to pass therethrough; a filter chamber, the filter chamber including an air intake area coupled to the return damper of the heat exchange unit and the outside air inlet, the air intake area being configurable to receive at least one of the return air and the outside air, the filter chamber providing filtered air; a cooling unit coupled to the filter chamber that creates an air cooling area over which the filtered air passes to create the cooled air, the cooling unit including; and a cooling unit fan operable to push the filtered air through the air cooling area and into the cabinet cluster; wherein one or more of said exhaust fan and said cooling unit fan is configured with a weighted rotor assembly of at least 50 pounds for storing angular kinetic energy during rotation of the one or more of said exhaust fan and said cooling unit fan, the stored energy being sufficient to continue delivering at least a predetermined flow of cooled air from said cooling area into said cabinet cluster for an interim period between loss of the grid power to said air conditioning apparatus and the back-up generator coming on-line, and thereby prevent damage to said electronic equipment or a loss of cold CFM (cubic feet per minute) during the interim period.

BRIEF DESCRIPTION OF THE DRAWINGS

These and other aspects and features will become apparent to those of ordinary skill in the art upon review of the following description of specific embodiments in conjunction with the accompanying figures, wherein:

FIGS. 5B1 and 5B2 illustrate cut-away perspective views of an exterior and interior portion of the data center or co-location facility according to other embodiments.

FIG. 8 is a power spine that can also be used with the preferred embodiment.

FIGS. 11A and 11B illustrate a fan with a weighted rotor according to a preferred embodiment.

DETAILED DESCRIPTION OF THE PREFERRED EMBODIMENTS

Data center or co-location facility designs and methods of making and using the same are described, and specifically a data center air handling unit including uninterruptable cooling fan with weighted rotor.

Figure 1A:
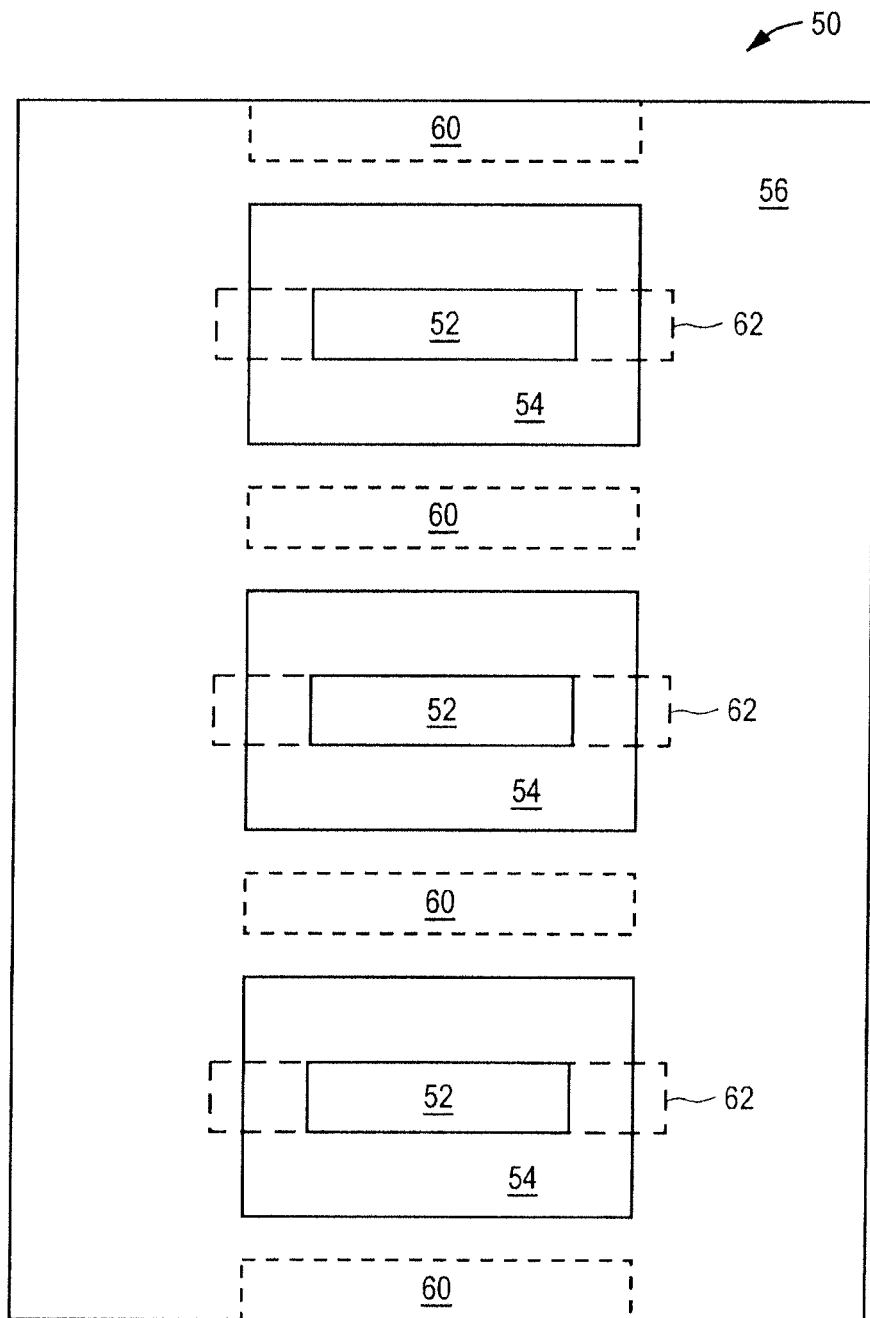
FIG. 1A illustrates a floor design used in a data center or co-location facility.

FIG. 1A illustrates a floor design used in the data center or co-location facility. The preferred embodiment discussed herein uses parallel rows of equipment configured back-to-back so that each row of equipment generally forces the heat from the electronic equipment towards a hot aisle, thus also establishing a cold aisle in the front of the equipment. The cold aisles in FIG. 1A are illustrated at the dotted line block 60, wherein the hot aisles are illustrated at the dotted line block 62. One feature is the provision for marking the floor 50 to explicitly show the various areas of the facility. As illustrated, the hot aisle 62 has a central area 52 that is tiled, painted, taped or otherwise marked to indicate that it is center area of the hot aisle 62, also referred to as a central hot air area. The typical dimensions of the central area 52 are typically in the range of 2'-4' across the width, with a row length corresponding to the number of electronic cabinets in the row. Marking with tiles is preferable as the marking will last, and tiles that are red in color, corresponding to the generation of heat, have been found preferable. Around this center area 52 is a perimeter area 54, over which the cabinets are installed. This perimeter area 54 is marked in another manner, such as using a grey tile that is different in color from the center area 52. Around the perimeter area 54 is an outside area 56, which is marked in yet a different manner, such as using a light grey tile. The placement of these markings for areas 52, 54 and 56 on the floor of the facility, preferably prior to moving any equipment onto the floor, allows for a visual correspondence on the floor of the various hot and cold aisles. In particular, when installing cabinets over the perimeter 54 are, the area that is for the front of the cabinet that will face the cold aisle, and thus the area for the back of the cabinet for the hot aisle, is readily apparent.

Figure 1B:
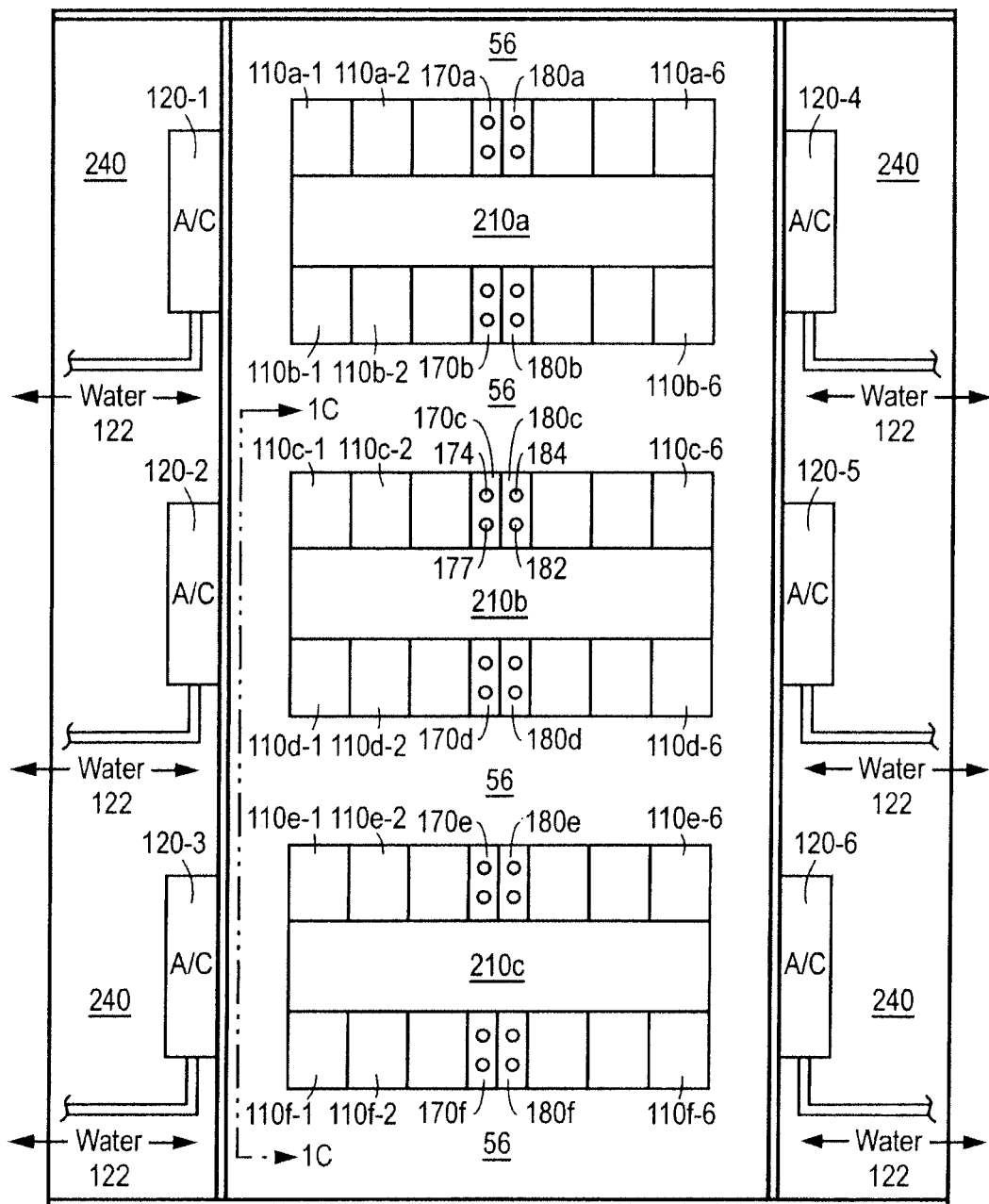
FIG. 1B illustrates floor-based components disposed over the floor design.

FIG. 1B illustrates floor-based components disposed over the floor design of the co-location facility. FIG. 1B also shows additional area of the floor, which in this embodiment is provided to illustrate interaction of the electronics equipment with the evaporators of the air conditioning units. In the embodiment described with respect to FIG. 1B, certain features are included so that conventional equipment, particularly conventional air conditioning equipment, can effectively be used while still creating the desired air flow patterns as described herein.

Before describing the components in FIG. 1B, a desired aspect is to isolate the hot air exhaust from the areas that require cooling as much as possible, and to also create air flows in which the air moves through the exhaust system, into the air conditioning system, through the air conditioning ducts and out to the cool equipment in a very rapid manner. In particular, the amount of circulation established moves air at a volume such that the entire volume of air in the facility recirculates at least once every 10 minutes, preferably once every 5 minutes, and for maximum cooling once every minute. It has been found that this amount of recirculation, in combination with the air flows established, considerably reduce the temperature in the facility in an environmentally efficient manner.

Cabinets 110 shown in FIG. 1B are placed generally over the sides of the perimeter 54 as described, in rows. Different rows are thus shown with cabinets 110(a-f), with each letter indicating a different row. Also included within the rows are telecommunications equipment 170 to which the electronics equipment in each of the cabinets 110 connect as described further herein, as well as power equipment 180, containing circuit breakers as is known to protect against energy spikes and the like, that is used to supply power along wires to the electronics equipment in each of the cabinets 110 connect as described further herein. Air conditioning units include the evaporator units 120(I-6) that are shown being physically separated by some type of barrier from the area 56 described previously with respect to FIG. 1A The condenser units of the air conditioning system that receive the warmed refrigerant/water along lines 122 and are disposed outside the walls of the facility are not shown. This physical separation is implemented in order to establish warm exhaust channel area 240 separate from the physical space, which warm air area will connect to a separate warm air area in the ceiling and allow the warm air to flow into the exhaust channel area 240 and enter into intake ducts of evaporator air conditioning equipment 120, as will be described. This feature allows the usage of conventional evaporator air conditioning equipment that has air intakes at the bottom of the unit, as well as allows for usage of different air conditioning equipment types, while still maintaining an efficient airflow throughout the entire facility.

FIG. I C illustrates a perspective cut-away view along line c-c from FIG. 1A of the FIG. 1A co-location facility. Additionally illustrated are the ceiling 140 and the actual ceiling 150, which have a gap that is preferably at least 1.5-3 feet and advantageously at least 15 feet, as the higher the ceiling the more the warm air rises (and thus also stays further away from the equipment in the cabinets 110). The ceiling 140 is preferably made of tiles that can be inserted into a suspended ceiling as is known, which tiles preferably have are drywall vinyl tiles, which exhibit a greater mass than many conventional tiles. Also shown are arrows that illustrate the air flow being centrally lifted upward from the hot air area containment chamber 210 formed by the thermal shields 400 to the area between the ceiling 140 and the actual ceiling 150, and the flow within the ceiling toward the warm exhaust channel area 240, and then downward into the warm exhaust channel area 240 with the wall 130 separating the area 56 and the warm exhaust channel area 240. Also shown are arrows that take cold air from the cold air ducts 310 and insert the air into the cold aisles 60.

Though the arrows in the drawing are directed straight downward, the vents themselves can be adjusted to allow for directional downward flow at various angles. In a preferred embodiment, each of the vents have a remote controlled actuator that allows for the offsite control of the vents, both in terms of direction and volume of air let out of each vent. This allows precise control such that if a particular area is running hot, more cold air can be directed thereto, and this can be detected (using detectors not shown), and then adjusted for offsite.

Figure 2A:
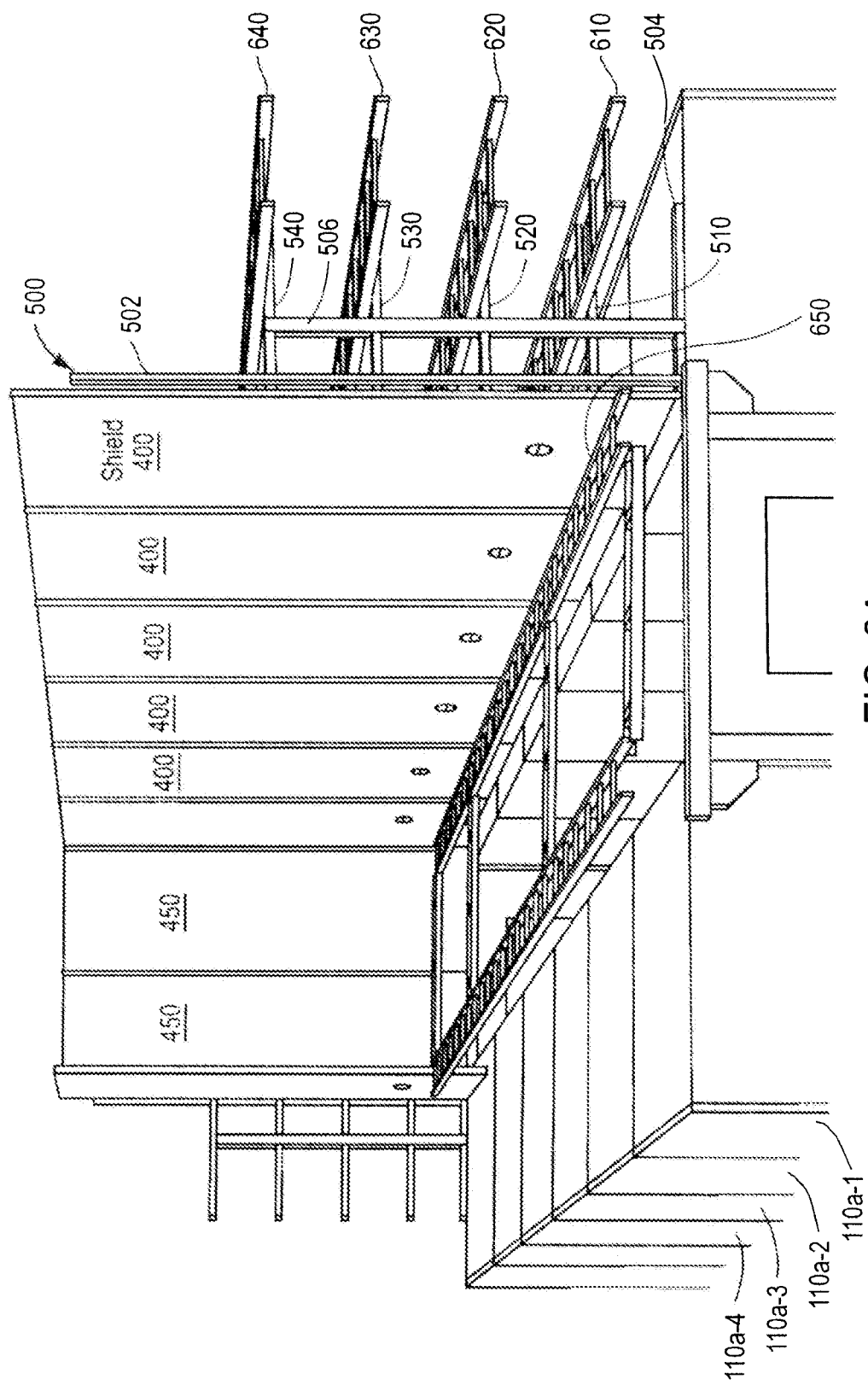
FIGS. 2A, 2B and 2C illustrate various cut-away perspective views of the thermal compartmentalization and cable and conduit routing system.
Figure 2B:
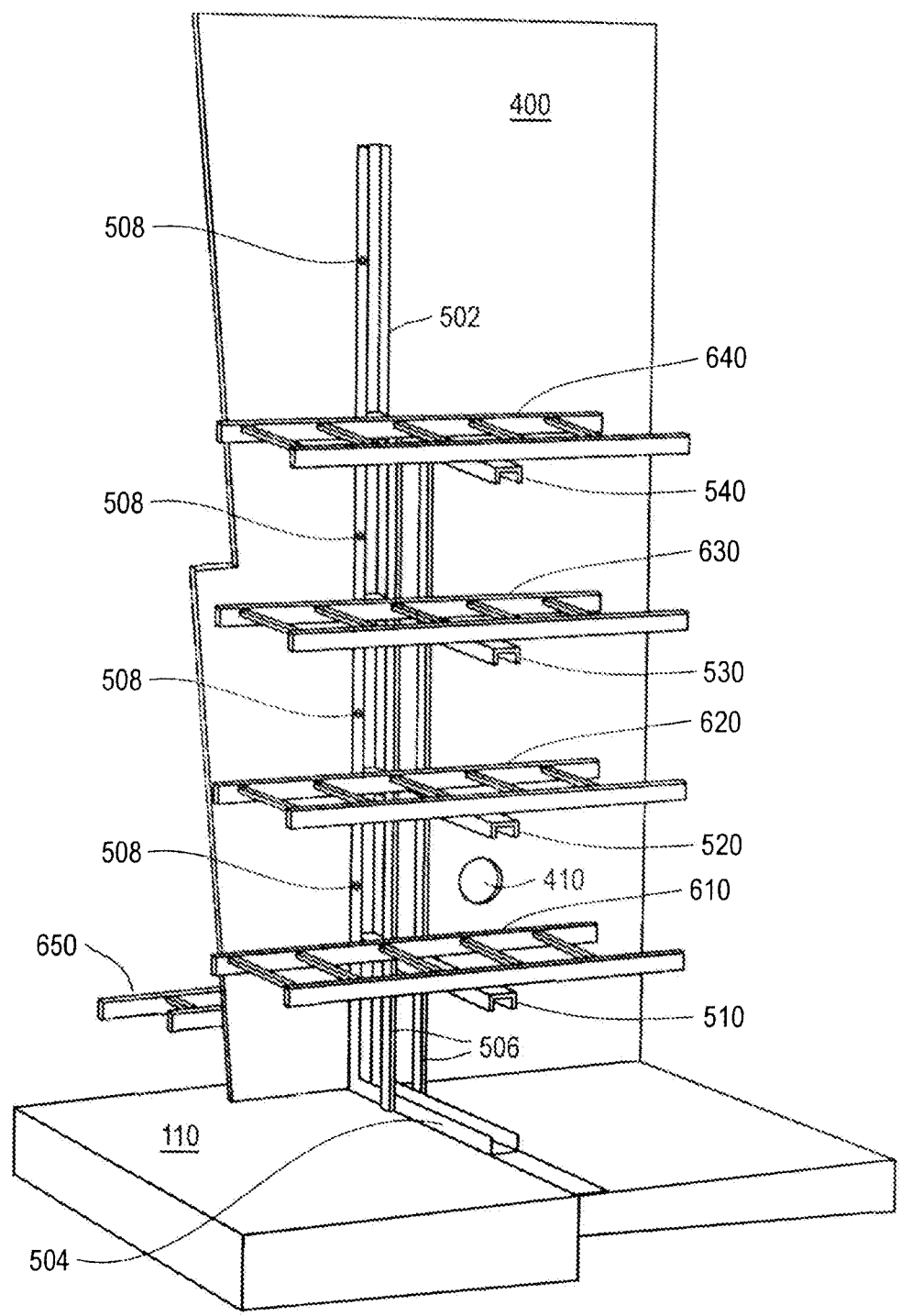
Figure 2C:
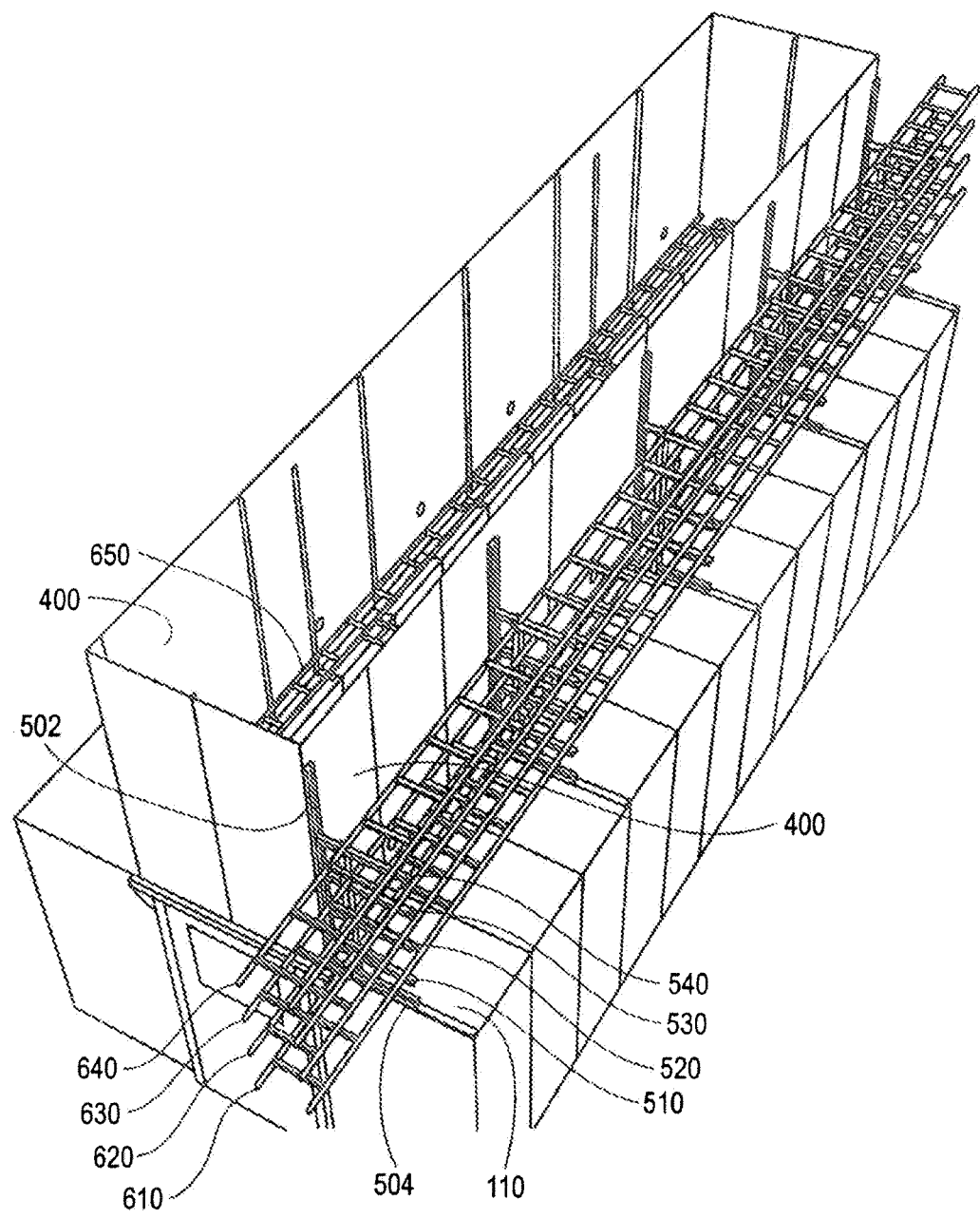

FIGS. 2A, 2B and 2C illustrate various cut-away perspective views of the thermal compartmentalization and cable and conduit routing system. In particular, FIG. 2A illustrates a cut away view of a portion of the hot air area containment chamber 210, which rests on top of the cabinets 110, and is formed of a plurality of the thermal shields 400 and 450, which are modular in construction and will be described further hereinafter. Also illustrated are shield brackets 500 that are mounted on top of the cabinets 110 and provide for the mounting of the shields 400 and 450, as well as an area on top of the cabinets 110 to run power and telecommunications cables, as will be described further herein.

Figure 4:
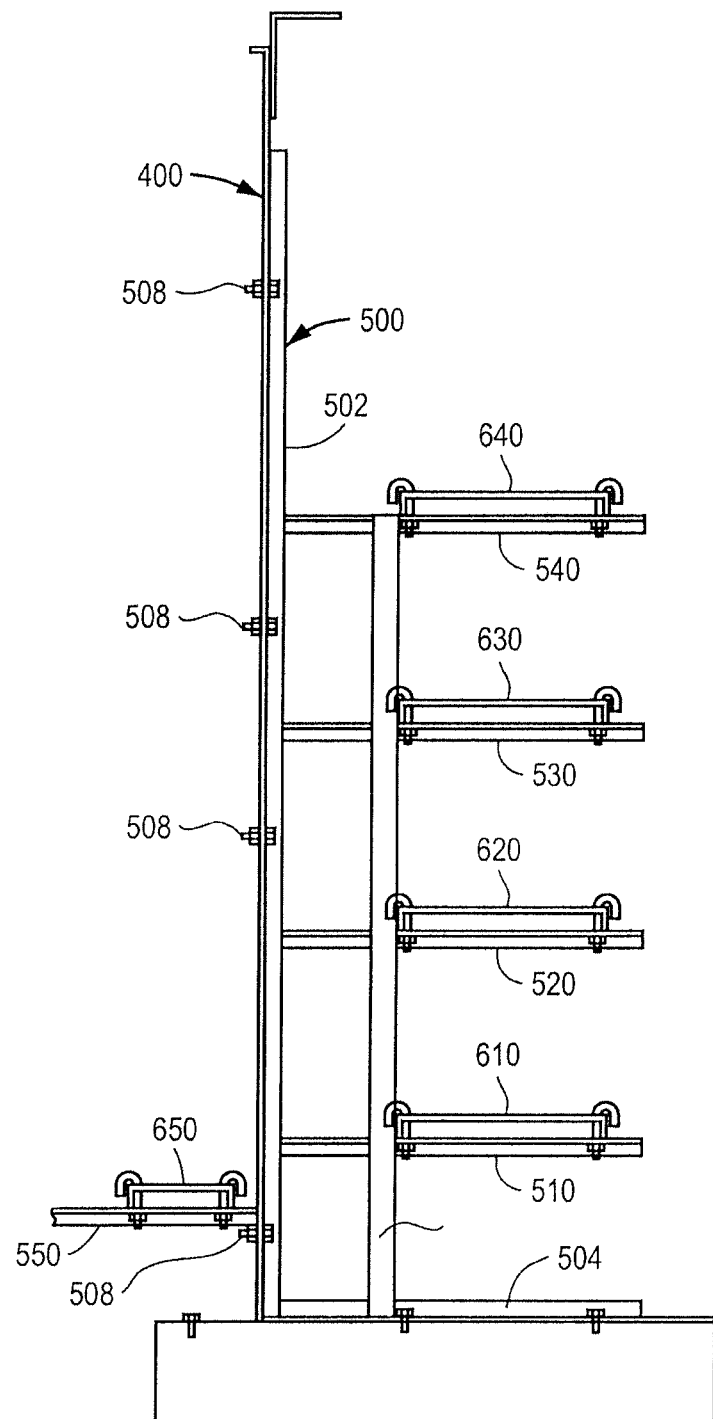
FIG. 4 illustrates a telecommunication bracket used in the thermal compartmentalization and cable and conduit routing system.

Before describing the cabling, FIG. 2B and FIG. 4 illustrate the shield and cabling support bracket 500, which is made of structurally sound materials, such as steel with a welded construction of the various parts as described, molded plastic, or other materials. Ladder rack supports 510, 520, 530, 540 and 550 are attached to back vertical support 502 of the shield and cabling support bracket 500 and used to allow ladder racks 610, 620, 630, 640, and 650 respectively, placed thereover as shown. The ladder racks are intended to allow for a segregation of data and electrical power, and therefore an easier time not only during assembly, but subsequent repair. The ladder racks are attached to the ladder rack supports using support straps shown in FIG. 4, which are typically a standard "j" hook or a variant thereof. As also illustrated in FIG. 4, a support beams structure 506 provides extra support to the ladder rack, and the holes 508 are used to secure the shields 400 and 450 thereto. Horizontal support plate 504 is used to support the support bracket 500 on the cabinets 110.

With respect to the cabling and conduit, these are used to provide electrical power and data to the various servers in the facility. Conduit, containing wiring therein, is used to provide electricity. Cabling is used to provide data. In this system, it is preferable to keep the electrical power and the data signals separated.

Within the system, ladder rack 610 is used for data cabling on the cold aisle side of the thermal shields 400. Ladder rack 620 is used for an A-source power conduit (for distribution of 110-480 Volt power) on the cold aisle side of the thermal shields 400. Ladder rack 630 is used for B-source power conduit (for distribution of 110-480 Volt power), which is preferably entirely independent of A-source power conduit, on the cold aisle side of the thermal shields 400. Ladder rack 640 is used for miscellaneous cabling on the cold aisle side of the thermal shields 400. Ladder rack 650 is used for data cabling on the hot aisle side of the thermal shields 400.

Figure 3A:
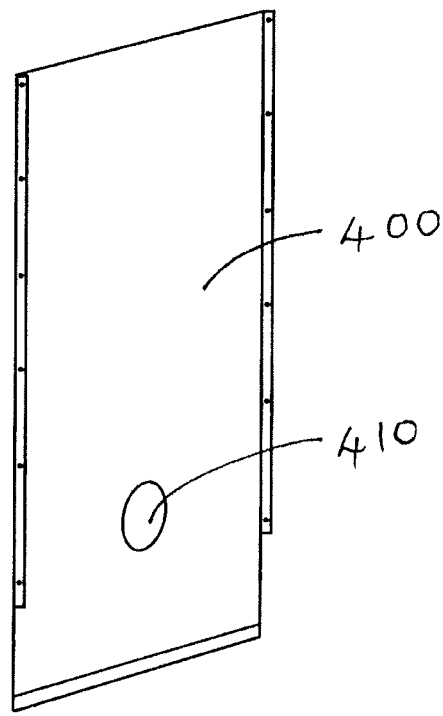
FIGS. 3A and 3B illustrate modular thermal shields used m the thermal compartmentalization and cable and conduit routing system.
Figure 3B:
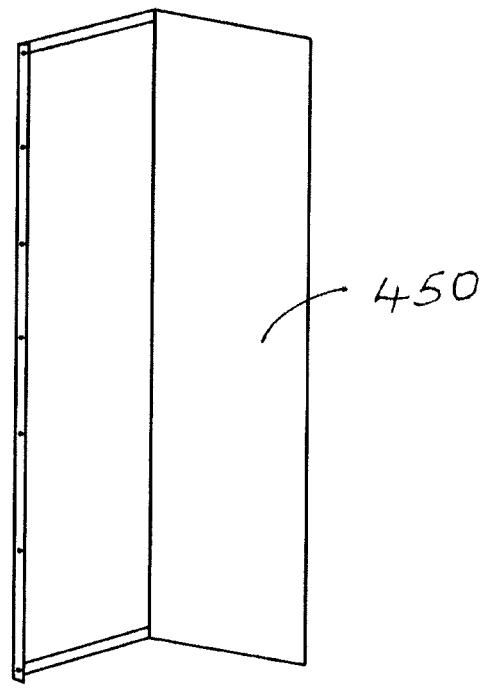

FIGS. 3A and 3B illustrate modular thermal shields 400 and 450, respectively, used in the thermal compartmentalization and cabling and conduit routing system. Both shields 400 and 450 are made of a structurally sound material, including but not limited to steel, a composite, or a plastic, and if a plastic, one that preferably has an air space between a front piece of plastic and a back piece of plastic for an individual shield 400. Shield 400 includes a through-hole 410 that allows for certain cabling, if needed, to run between the hot and cold aisle areas, through the shield 400. A through-hole cover (not shown) is preferably used to substantially close the hole to prevent airflow therethrough. Shield 450 has a 90 degree angle that allows the fabrication of corners.

It should be appreciated that the construction of the cabinets, the shields 400 and 450, and the shield supports 500 are all uniform and modular, which allows for the efficient set-up of the facility, as well as efficient repairs if needed.

Other different embodiments of data center or co-location facilities also exist. For example, while the ceiling 140 is preferred, many advantageous aspects can be achieved without it, though its presence substantially improves airflow. Furthermore, the evaporation units for the air conditioning system can also be located outside the facility, in which case the chamber 240 is not needed, but hot air from the ceiling can be delivered to evaporation units that are disposed above the ceiling, which is more efficient in that it allows the warm air to rise. If the complete air conditioning equipment is located outside, including the evaporators, the refrigerant/water lines 122 that are used to exchange the refrigerant/water if the evaporators are disposed inside the facility is not needed, which provides another degree of safety to the equipment therein.

It is noted that aspects described herein can be implemented when renovating an existing facility, and as such not all of the features are necessarily used.

Data Management Center and Integrated Wiring System

In one aspect, the embodiments herein are directed to an overall data management center, including the building itself, interior aspects of the building, as well as equipment purposefully located outside yet in close proximity to the building, which equipment is used for purposes of providing both building cooling as well as supplemental power, as described further herein. In one particular aspect, the center core of the building that contains the electronics equipment is purposely created in a manner that provides only essential equipment and ducts needed to provide power, communications, and air flow, while putting into periphery areas of the building and outside, other equipment that could interfere with the electronics equipment, whether due to that other equipment requiring extremely high power and/or water or other liquids to function, all of which can have a detrimental impact on the electronics equipment.

Figure 5A:
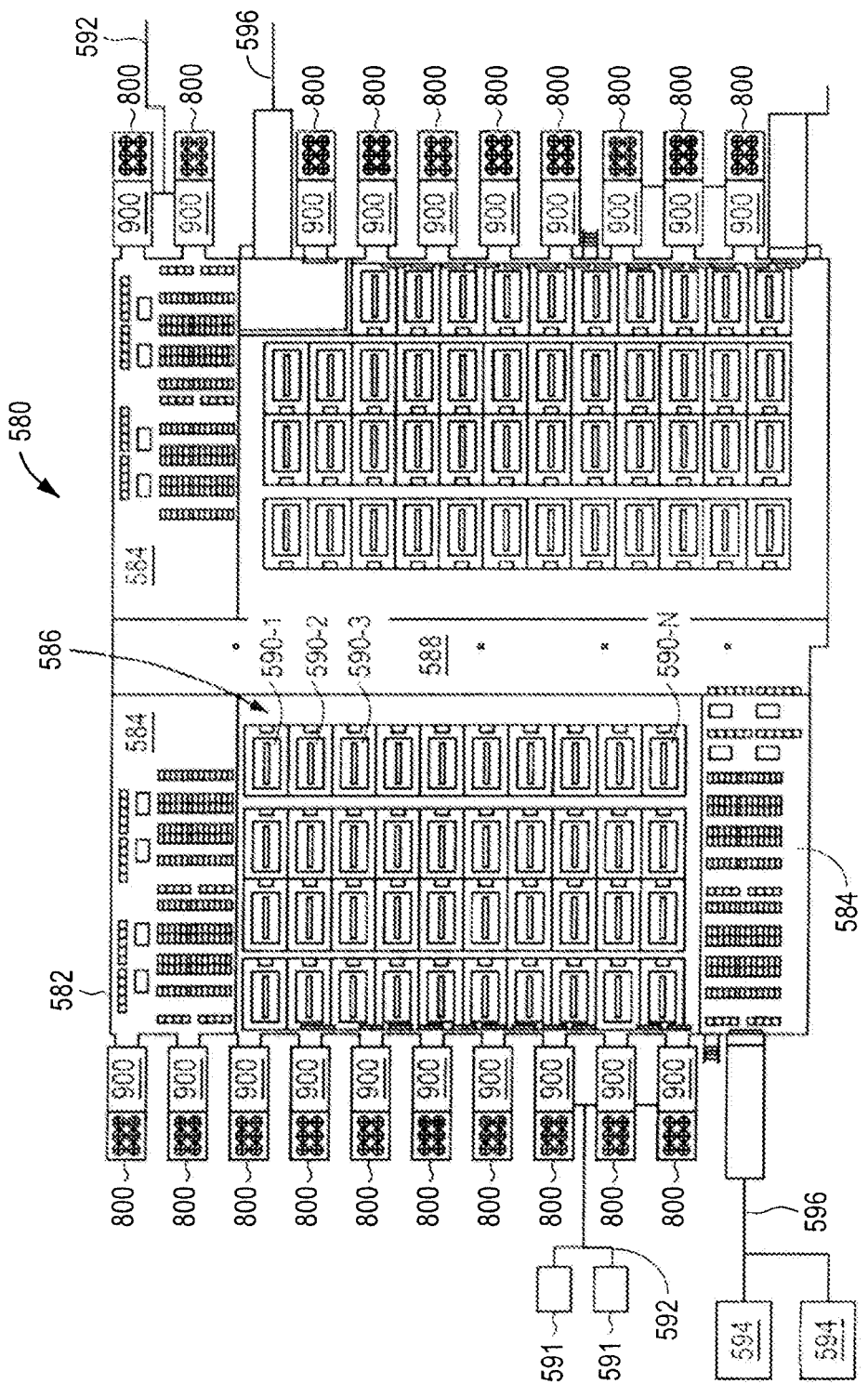
FIG. 5A illustrates a top view of a data center or co-location facility according to another embodiment.

FIG. 5A illustrates a top view of a portion of a data center or co-location facility 580 according to another embodiment. In this embodiment, unlike the embodiment shown in FIG. 1A-C, the condenser air conditioning units 800 and heat expulsion chamber 900 are all disposed outside of the exterior walls 582 of the facility, as will be described further herein. There is also additional equipment disposed outside of the exterior walls 582, including evaporation units 591 that feed cooled water along lines 592 to the air conditioning units 800 as described further herein, as well as backup diesel generators 594 for supplying backup power along a transmission line 596 in the case of power outage from remotely supplied power on the national power grid.

FIG. 5B 1 illustrates a cut-away perspective view of an exterior and interior portion (with a 90° rotation for illustrative purposes of the interior portion) of the data center or co-location facility 580, with the exterior wall 582 being explicitly illustrated. Shown are two of the cabinet clusters 590-1A and 590-2A, and the corresponding hot air area containment chambers 210 and cold air ducts 310, which are respectively connected to the warm exhaust outlets 240-0 and cold duct inlets 310-I. The warm exhaust outlets 240-0 and cold duct inlets 310-I connect to heat expulsion chamber 900 and condenser units 800, respectively.

FIG. 5B2 provides a slightly varied embodiment, in which the cold duct inlets 310-1 and warm exhaust outlets 240-0 are each at the same level as the condenser units 800 and heat expulsion chamber 900, respectively, and the warm exhaust outlets 240-0 contain a 90° angled area, which allows for better hot air flow into the heat expulsion chambers 900.

Within the facility there are provided distribution areas 584 and 588, as shown in FIG. 5A, as well as data center equipment areas 586, which equipment areas 586 each contain an array of cabinet clusters 590 (shown in one of the rows as cabinet clusters 590-1, 590-2, 590-3 . . . 590-N), since within each cabinet cluster 590, various cabinets 110 containing different electronic equipment are disposed in rows, thereby allowing each cabinet cluster 590 to be locked, as well as the cabinets 110 within the cabinet cluster 590. It is apparent that three consecutive cabinet clusters, such as 590-1, 590-2 and 590-3 correspond to the three identified clusters that are disposed around the associated hot air area containment chambers 210(a), 210(b) and 210(c) in FIG. 1B. As is illustrated, the electronics equipment within each cabinet 110 of a cabinet cluster 590 is connected in a manner similar to that as described in FIGS. 2A, 2B, and 2C previously.

It is noted that the cabinet cluster may have an actual physical perimeter, such as a cage built with fencing that can be locked and still permits airflow therethrough, or alternatively need not have an actual physical perimeter, in which case the orientation of the cabinets 110 and corresponding other structures as described previously with reference to FIGS. 1A-C can also define this same space.

The manner in which the distribution power wires and conduits, electronic equipment control wires and conduit, data cabling, and miscellaneous cabling is distributed to the cabinet clusters 590 from one of the distribution areas 584 or 588 will be described further hereinafter. As shown in FIG. 5A, telecommunications and power distribution equipment, further described herein, is used to then feed the appropriate signals and power to the telecommunications equipment and power equipment that is stored within each cabinet cluster 590 (i.e., telecommunications equipment 170 and power equipment 180 described in FIG. 1B). The manner in which the distribution power wires and conduits, electronic equipment control wires and conduit, data cabling, and miscellaneous cabling is distributed to the cabinet clusters 590 from one of the distribution areas 584 and 588 will be described further hereinafter.

Figure 6A:
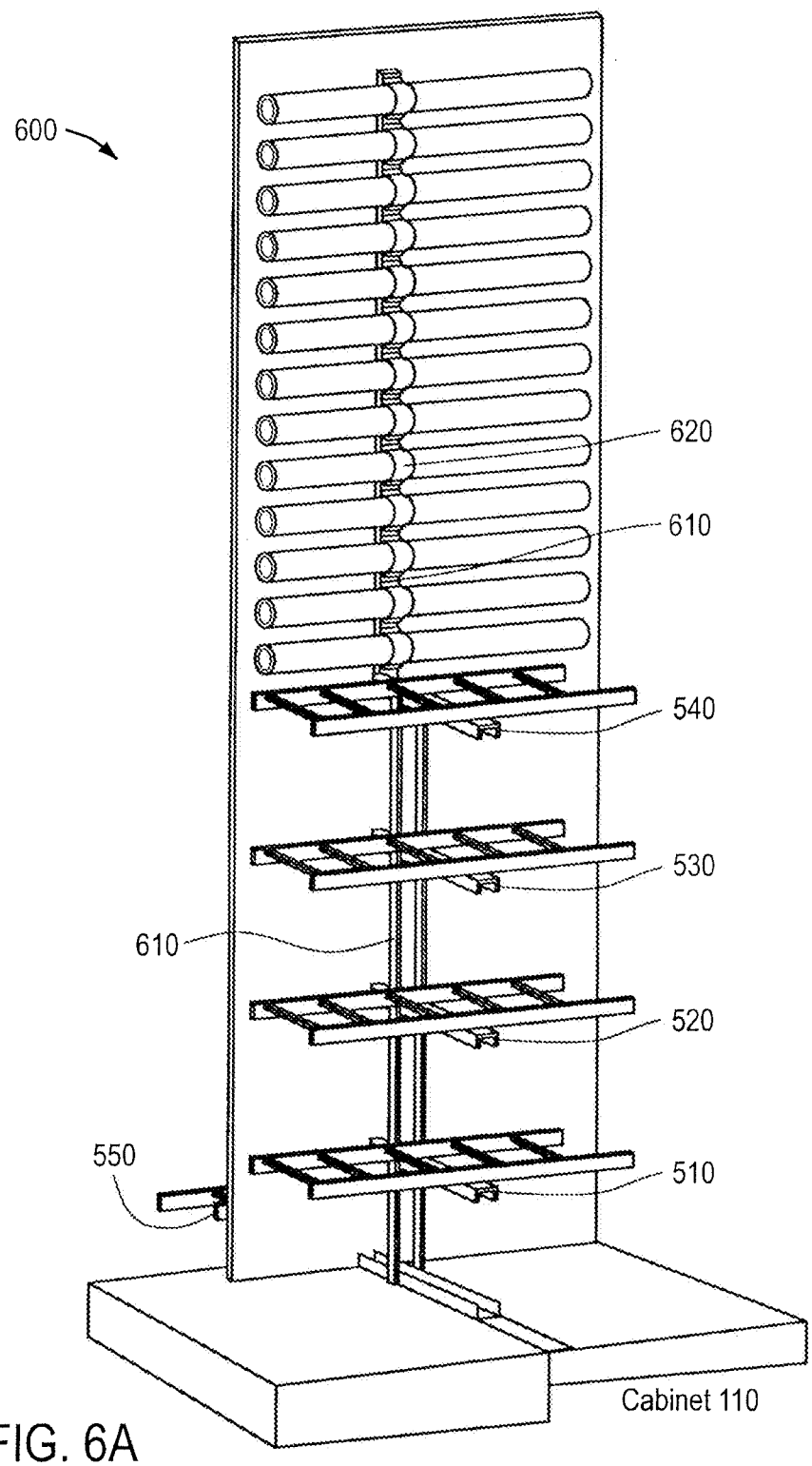
FIGS. 6A and 6B illustrates other telecommunication brackets used in the thermal compartmentalization and cable and conduit routing system.

The array of cabinet clusters 590, and the density of the cabinets 110 and the electronics equipment therein, require substantial amounts of power and transmission capacity, which in turns requires substantial amounts of wiring, particularly for power. As described herein, as a result an improved telecommunication bracket 600 is provided, as shown in FIG. 6A, which substantially rests over each of the cabinets in the cabinet clusters 590, in order to more easily accommodate the distribution power wires and conduits, as well as telecommunication wires and conduits, as well as control wires and conduits, that are then distributed from the distribution areas 584 and 588 to the telecommunications equipment 170 and power equipment 180 that is within each of the different cabinet clusters 590. As shown in Figure SA and FIG. 8, the distribution area 588 contains power distribution units (PDU's) 598, described in further detail elsewhere herein, and the distribution area 584 contains transformers to step down the power grid power that is normally at 12477 volts to a 480 volt level, for transmission of 480 volt power to the PDU's 598. Also within distribution area 584 are uninterruptable power supplies in case an outage of power from the power grid occurs, as well as equipment for testing of the various power equipment that is conventionally known.

Figure 7A:
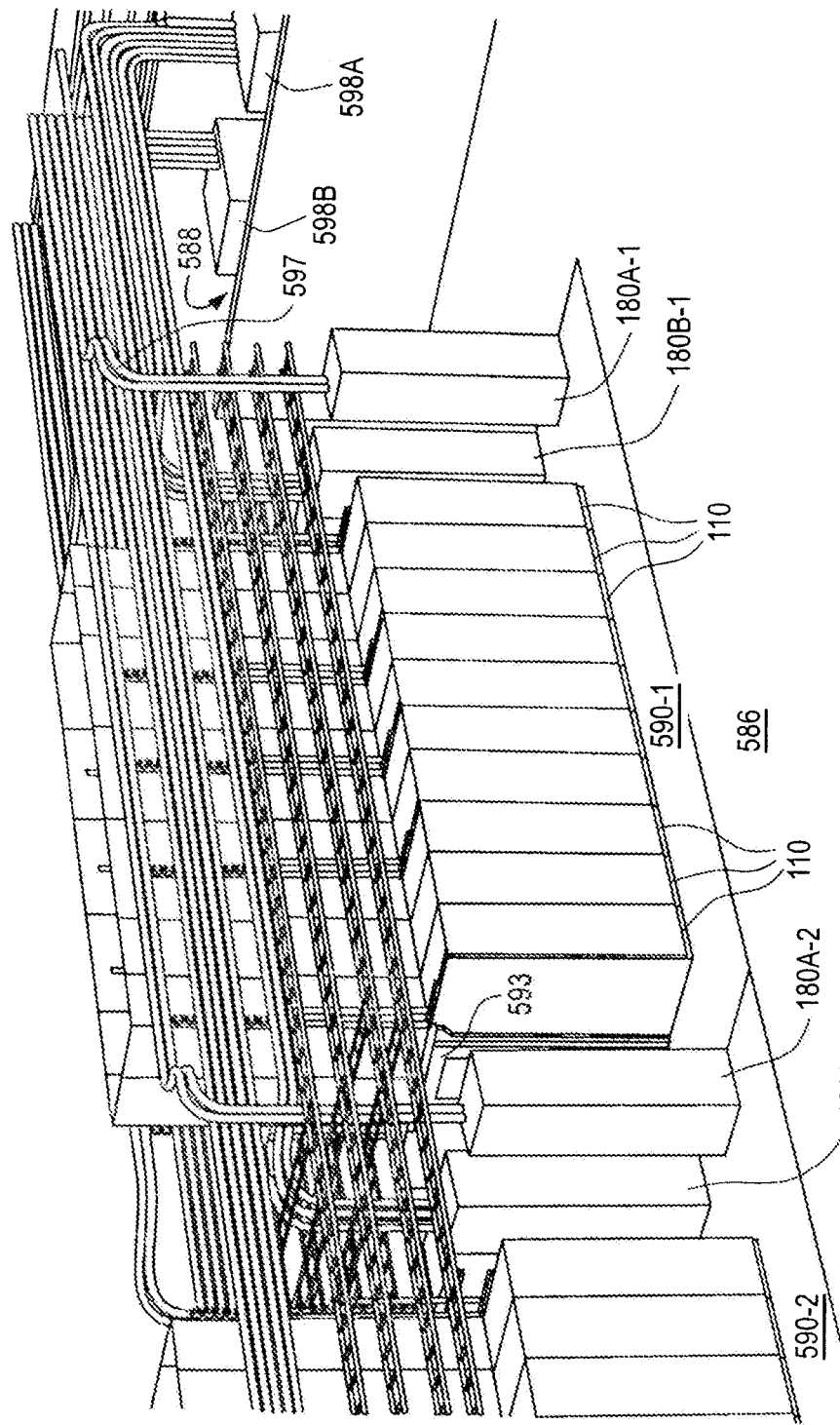
FIGS. 7A and 7B illustrate a section of a distribution area and the data area within a facility according to an embodiment.

While FIG. 1B illustrates one configuration of equipment with the cabinet cluster (with the telecommunications equipment 170 and the power equipment 180 within the center of a row), FIG. 7A also shows an alternative configuration of equipment for a cabinet cluster 590, which still contains the same cabinets 110, telecommunication equipment 170 and power equipment 180. In particular, rather than having the power equipment 180 centrally located within a row, in this alternate configuration the power equipment 180 is disposed at an end of each of the rows that are within a cabinet cluster 590. The telecommunication equipment, within this embodiment, can be located anywhere within the row of cabinets 110, within whichever one of the cabinets 110 makes most sense given the usage considerations for that cabinet cluster 590.

In another variation of the FIG. 7A embodiment, the power equipment 180, instead of being somewhat separated from the cabinets 110 within a cluster 590, instead abut right next to one of the cabinets 110. This, along with the doors 593 shown in FIG. 7A then being attached between adjacent power equipment at the end of the cabinet row instead of at the end cabinet, keep all the equipment in a tightly configured space. In any of the embodiments shown, whether FIG. 1C, 7A or as described above, the thermal shield 400 that creates the hot air area containment chamber 210 above the cabinets, coupled with the doors that seal off the area between the rows of cabinets 110 within a cluster 590, provide an environment that prevents the hot air within the hot air area 52 from escaping out into the main data center floor, and ensures that the hot air instead travels up through the hot air area containment chamber 210 and into the gap disposed between the ceiling 140 and the actual ceiling 150.

Within equipment area 586 is thus established an array of cabinet clusters 590, which cabinet clusters align with each other to allow for the overhead stringing of telecommunications and power wiring as described herein. Within each cabinet cluster 590, as also shown in FIG. 1B, is telecommunications equipment 170 to which the electronics equipment in each of the cabinets 110 connect, as well as power equipment 180 used to connect the electronics equipment to power. The array of cabinet clusters 590, each also containing brackets, such as brackets 500 or 600, as described herein. For a larger size data center as illustrated in FIG. 5A that contains a very large array of cabinet clusters 590, brackets 600 are preferable, as they allow for additional conduit support areas. These brackets 600, discussed further herein with respect to FIGS. 6A and 6B, contain ladder racks 510, 520, 530 and 540 that are used for stringing power and telecommunication wiring within each cabinet cluster 590, as well as contain additional vertical support with conduit clamps that are used to hold power and telecommunication lines that pass from each cabinet cluster 590 to other central telecommunication and power distribution areas, as discussed further herein, as well as to hold power and telecommunication lines that pass over certain of the cabinet clusters 590 in order to be strung to other of the cages areas 590. Still further, these same brackets 600, being preferably mounted over the cabinets 110, and at least having a significant portion of the bracket disposed over the cabinets 110, are used to mount the thermal shield within the cabinet cluster 590, the thermal shield providing a contiguous wall around the central hot air area of the cabinet cluster 590, and defining a warm exhaust channel that traps the heated air within the central hot air area and causes substantially all the heated air within the central hot air area to rise up within the warm exhaust channel. These brackets 600 also preferably span from the top of the cabinets 110 to the bottom of the ceiling 140 to provide further stability.

It is apparent that the power and telecommunication lines that pass from each cabinet cluster 590 to other more central telecommunication and power distribution areas will necessarily pass, in some instances, over other cabinet clusters 590. Since the vertical support 610 with conduit clamps 620 are above the ladder racks 510, 520, 530 and 540 for each of the brackets 600, as well as above each of the cabinets 110, this allows for long runs of power and telecommunication lines that pass from each cabinet cluster 590 to other more central telecommunication and power distribution areas to exist without interfering with the wiring that exists within each cabinet cluster 590. Furthermore, by creating a sufficient area of vertical support and conduit clamps, it is then possible to run additional power and telecommunication lines from certain cabinet clusters 590 to other more central telecommunication and power distribution areas without having to re-work existing wiring. This makes expansion much simpler than in conventional designs.

Figure 6B:
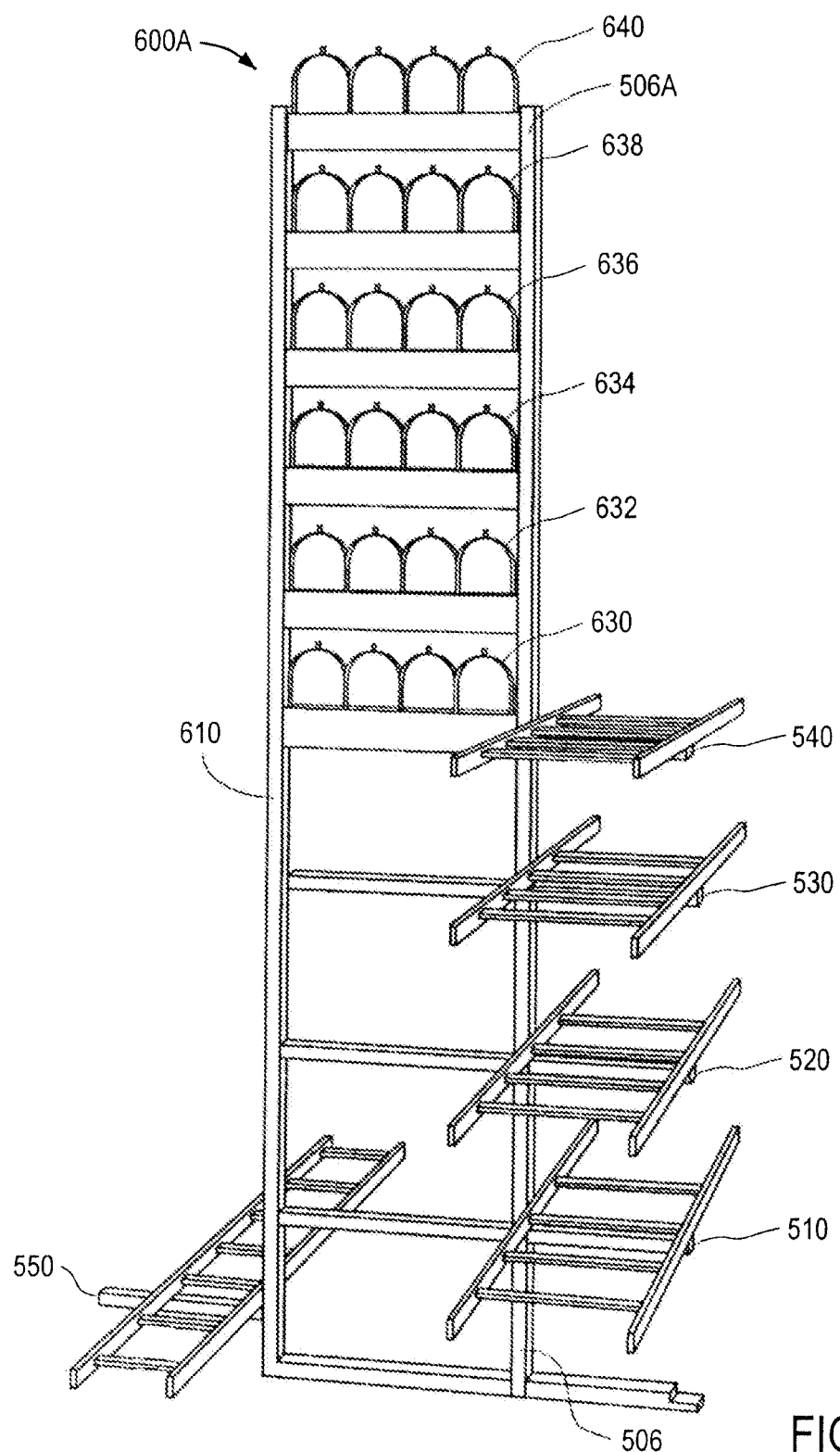

FIGS. 6A and 6B illustrate in detail two different embodiments of the telecommunication bracket 600 referred to above that is used in the thermal compartmentalization and cable and conduit routing system. This bracket 600 serves the same purpose as the bracket 500 illustrated and described previously with respect to FIG. 4, and as such similar parts of the bracket 600 are labeled the same and need not be further described herein. This bracket 600, however, additionally provides additional vertical support 610 that allows for the running of additional wiring and conduits.

In FIG. 6A, this additional vertical support 610 includes conduit clamps 620 that allow the clamping of the additional conduits to the additional vertical support 610.

In FIG. 6B, the bracket 600A has in addition to the vertical support 610 a support beam 506A (which extends upwards from the support beam 506 shown in FIG. 4), and racks 630, 632, 634, 636, 638, and 640 therebetween. Each of the racks 630, 632, 634, 636, 638, and 640 have room for at least 4 different 4" conduits to run wiring or cabling therethrough. Whether the conduit clamps or additional conduit racks are used, both provide for conduit holding, and holding of the wires or cables within the conduits.

In both the brackets 600 of FIGS. 6A and 6B, the additional wiring/conduit is distribution power wires and conduits and other wire/conduit for control uses, for example. As explained hereafter, the distribution power wires and conduits can run from various power equipment units 180 disposed in each of the cabinet clusters 590 to various other high power distribution units (PDUs) 598 disposed within the distribution area 588, as shown in FIG. 7A

FIG. 7A also illustrates the distribution of power PDUs 598 within a section of the distribution area 588 to power equipment 180 in an end cabinet cluster 590-1 within a section of the data equipment center area 586 via distribution power wires and conduit (one shown as 597). In particular, as is shown, distribution power wires and conduit goes from each of the PDUs 598A and 598B to the power equipment unit 180A within the end cabinet cluster 590-1, and distribution power wires and conduit also goes from both the PDUs 598A and 598B to the power equipment unit 180B within the end cabinet cluster 590-1, so that redundant power can be provided to the electronic equipment within each row. Since power is provided to each piece of power equipment 180 from two different sources, these power equipment units can also be called redundant power panels, or RPP's. In addition, distribution power wires and conduit go from each of PDUs 598A and 598B over the end cabinet cluster 590-1 to further cabinet clusters 590-2, 590-3 to 590-N. The array of cabinet clusters 590 are aligned as shown in FIG. 5A so that the brackets 600 in different cabinet clusters 590 nonetheless can together be used to string distribution power wires and conduit and other wires/fibers with conduits as needed.

In a preferred configuration of the power equipment 180 shown in FIG. 7A provides redundant 120 Volt AC power from each RPP 180 to the electrical equipment in each of the cabinets 110 within the row of the cabinet cluster 590. Within the RPP 180 are circuit breakers as is known to protect against energy spikes and the like, as well as energy sensors associated with each circuit so that a central control system, described hereinafter, can monitor the energy usage at a per circuit level. In a typical implementation, there are 42 slot breaker panels that are associated each with 120/208V power that is then supplied to each of the electronic components as needed, in wiring that uses one of the ladder racks 630 or 640 as discussed previously to the necessary cabinet 110. Of course, other power configuration schemes are possible as well.

Figure 7B:
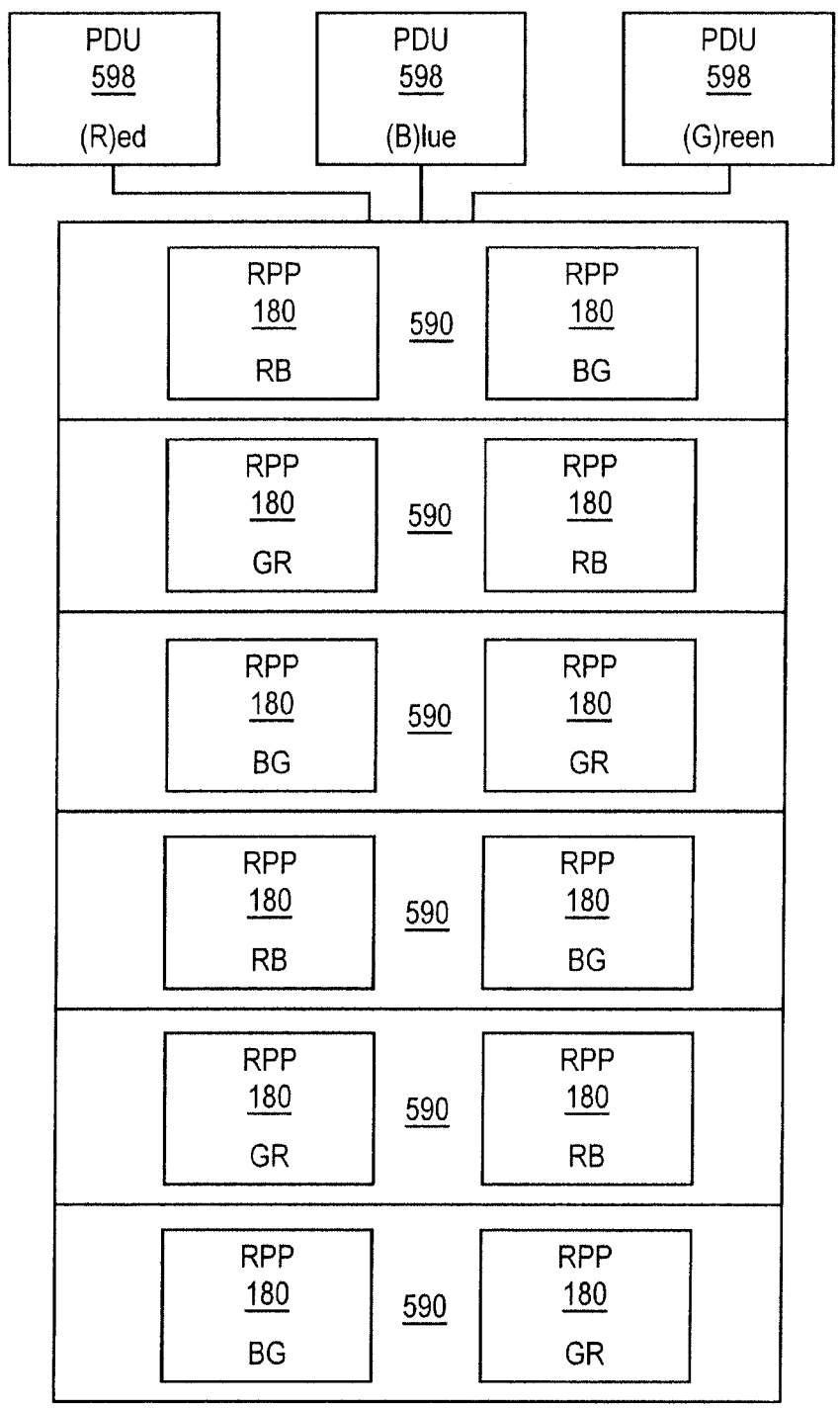
Figure 9A:
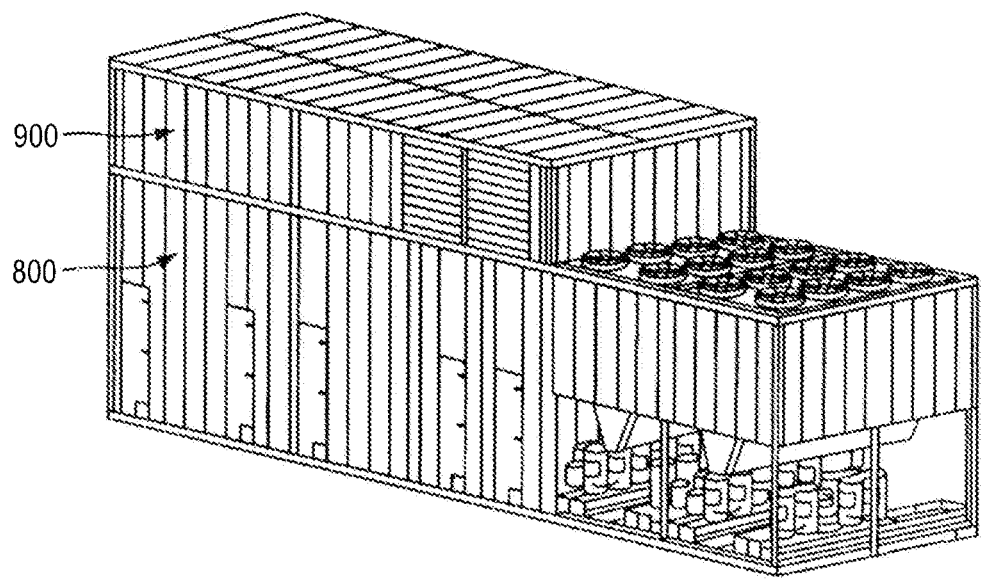
FIGS. 9A, 9B, 9C, 9D and 9E illustrate an air handling unit according to a preferred embodiment.
Figure 9B:
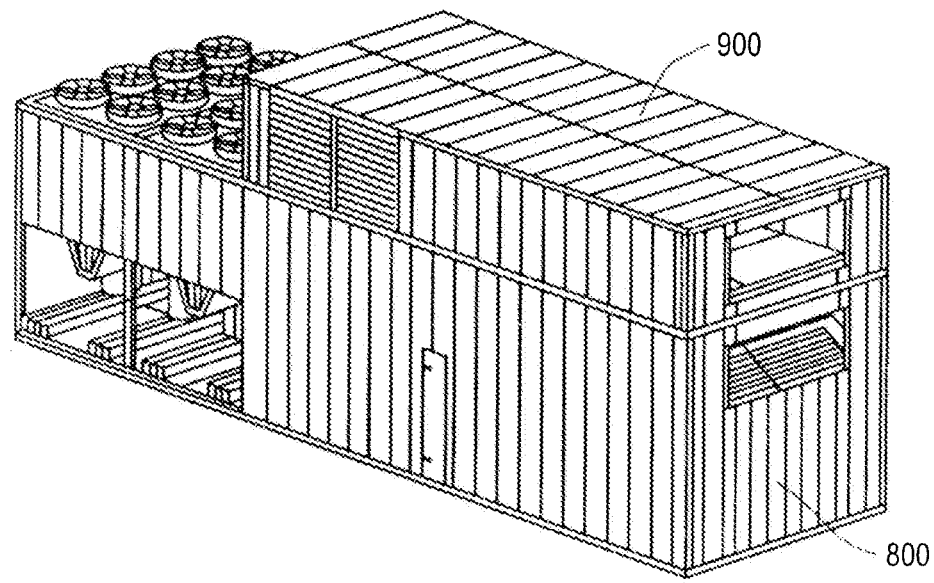
Figure 9C:
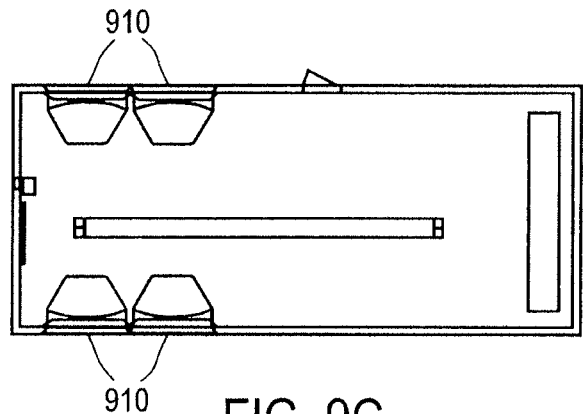
Figure 9D:
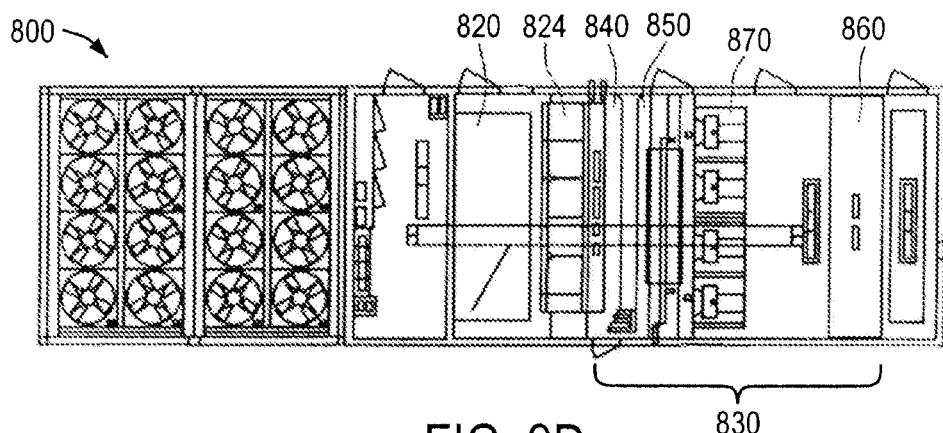
Figure 9E:
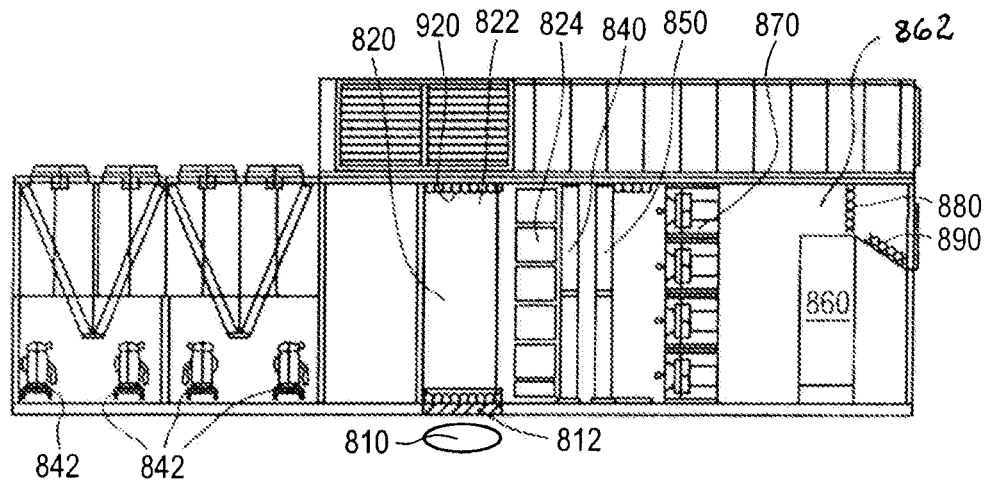

In a preferred configuration for a module of cabinet clusters 590, as schematically shown in FIG. 7B, there are three different PDUs 598 that each receive 480Vac 3-phase power and provide 120Vac 3-phase power service to each of 8 different RPPs 180 via the distribution power wires and conduits, although other power could be provided as well, such as 380Vac or 400Vac power. This allows, for a completely used module, 6 different cabinet clusters 590 to be serviced from 12 RPP's 180, two in each cage, and 3 different PDU's 598. By providing redundancy of both RPP's 180 (×2) and PDUs 598 (×3), this allows for maximum power usage of the various components with sufficient redundancy in case any one of the PDU's 598 or any circuit on an RPP 180 fails.

A lock-related aspect with respect to the RPPs 180 as well as the PDU's 598 is that since there are three circuits from the PDU's t the RPP's, within a dual RPP each side of the cabinet will have separate lock, such that all locks of a particular circuit can be opened by the same key, but that key cannot open locks of any of the other two circuits. This is an advantageous protection mechanism, as it prohibits a technician from mistakenly opening and operating upon a different circuit than a circuit he is supposed to service at that time.

FIG. 8 shows a power spine 599 that can also be used with the preferred embodiment to provide power from the power grid to each of the PDU's 598. As illustrated, rather than running the power spine through the roof as is conventionally done, in this embodiment the power spine 599 is run along a corridor within the distribution area 588 that channels all of the main building wiring and electrical components. This advantageously reduces stress on the roof and building structure, as the weight of the power spine and related components are supported internally within the corridor structure as shown.

Data Center Air Handling Unit

Another aspect of the data center is the air handling unit that provides for efficient cooling.

As is illustrated in Figures SA, SB1 and SB2, one condenser unit 800 is paired with one heat expulsion chamber 900, and each are preferably independently movable. As is further illustrated, the condenser units 800 are built to a size standard that allows for transport along US state and interstate highways. Further, the heat expulsion chamber 900 is preferably sized smaller than the condenser unit 800, but still having dimensions that allow for transport using a semi-trailer. When transported to the facility 500, the condenser unit 800 is first placed into position, as shown here on posts 588, but other platforms can also be used. As shown in this embodiment, the heat expulsion chamber unit 900 is placed over the condenser unit 800, though other placements, such as adjacent or below, are also possible. Connections of power conduit, miscellaneous cabling, and water needed for proper operation of the condenser units 800 and expulsion chamber 900 is preferably made using easily attachable and detachable components.

With this configuration, the units 800 and 900 are located in standardized, accessible and relatively convenient positions relative to the facility 580 should any of the units 800/900 need to be accessed and/or removed for repair or replacement. Further, these units 800/900 are themselves created using an intentionally transportable design.

FIGS. 9A through 9E provide further details regarding the condenser unit 800 and its paired heat expulsion chamber 900. In particular, as shown, the air conditioning apparatus includes the condenser unit 800 and its paired heat expulsion chamber 900. The heat expulsion chamber 900 receives heated air, and emits vented air, and the vented air is released into the external environment, while the condenser unit 800 emits cooled air.

Figure 10:
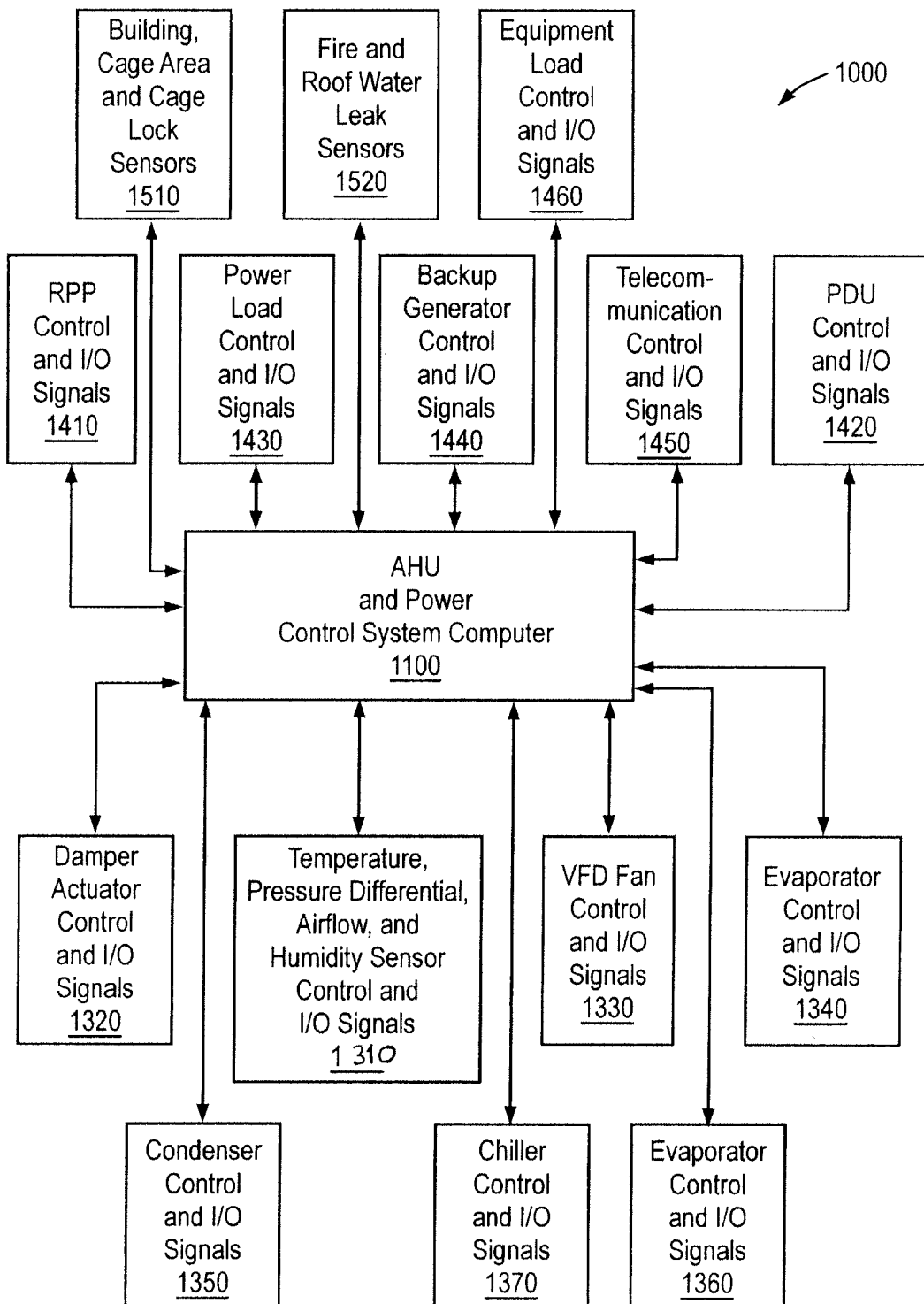
FIG. 10 illustrates a control system used by the data center.

The heat exchange unit 900 contains an exhaust fan 910, controlled by a variable frequency drive (VFD) fan control and I/O signals block 1330 shown in FIG. 10, that emits heat from the heated air as the vented air, thereby allowing return air to pass through a return damper 920, which return damper 920 has a return damper actuator associated therewith.

The condenser unit 800 includes an outside air inlet 810, and has associated an outside air damper 812, thereby allowing outside air to pass therein. This outside air damper 812 is preferably coated with a neoprene seal to prevent pollution particles from passing through the damper 812 when in a closed position, as well as contains a spring-loaded mechanism closing lever that will automatically close the outside air damper 812 upon a removal of power, so that outside air is prevented from intake before backup generators 594 have to start, since after a power-grid power failure condition, before the back-up generators start, uninterruptable power supplies will supply required building power, giving a period for the outside air damper 812 to close.

A filter chamber 820, which includes an air intake area 822 coupled to the heat expulsion unit 900 and the outside air inlet 810, is configurable, via the air handling unit (AHU) control system 1000, described hereinafter, to receive the return air, the outside air, as well as a mixture of the return air and the outside air, the filter chamber resulting in filtered air. In a preferred implementation of the filters 824 within the filter chamber 820 are included a minimum efficiency reporting value (MERV) 7 screen filter 824A with a MERV 16 bag filter 824B there behind, which allows replacement of the screen filter 824A without replacement of the bag filter 824B, and vice-versa.

The condenser unit 800 includes an air cooling area 830, having a surface area as large as practically possible for the condenser, over which the filtered air passes to create the cooled air. For ease of nomenclature, all of the air within the air cooling area 830 is referred to as filtered air, and only upon emission from the condenser unit is it referred to as cooled air. That notwithstanding, it is understood that along various stages of the air cooling area 830, the filtered air will get progressively cooler in temperature.

The air cooling area 830 of the condenser unit 800 includes a direct cooling coil 840 filled with a gas for direct expansion, such as R134 gas, over which the filtered air passes, the gas being circulated through a condenser 842 disposed in another area of the condenser unit housing, but still in the external area, outside of the building.

The air cooling area 830 also includes an indirect cooling coil 850 filled with cooled water over which the filtered air passes, the cooled water being circulated through an evaporation unit 590 also disposed in the external area, via a water line 592 as shown in FIG. 5(*a*). Optionally, though not shown, another coil that is cooled by a chiller could be included.

Also shown in FIGS. 9A through 9E is that the air cooling area also has an evaporator 860 that provides a water wall through which the filtered air can pass. An evaporator bypass 862 allows all or some of the filtered air to bypass the evaporator 860, and a bypass damper 880 is opened to allow 100% bypass of the evaporator 860, in which case the evaporator damper 890 is then fully closed. Filtered air can also be partially bypassed, or all go through the evaporator 860, depending on the percentage opening of each of the dampers 880 and 890.

Also within the air cooling area 830 is a fan 870, shown as a fan array of multiple fans, operable to push the filtered air through the air cooling area 830, as well as an outlet damper 880 controllable by an actuator and operable to control an amount of the cooled air delivered from the air cooling area 830.

As shown and mentioned previously the heat exchange unit 900 is contained within a first housing, and the condenser unit 800 is contained within a second housing.

Furthermore, and with reference to FIG. 10, overall air conditioning system for the data center 500 includes a control system 1000. The control system 1000 contains an air handling unit (AHU) and power control system computer 1100, which is operable to automatically control each of the exhaust fan 910, the return damper actuator, the outside air damper actuator, the condenser 842, the bypass damper actuator, the fan 870, and the outlet damper actuator.

Air Handling Control System

As referenced previously, and shown explicitly in FIG. 10, the data center 580 includes a control system 1000. The control system includes an air handling unit (AHU) and power control system (PCS) computer 1100, which as shown obtains signals from many different units, and sends signals to many different units, based upon various software routines run by the AHU/PCS computer 1100. These routines can be integrated with each other, as well as be discrete modules which operate on their own, or a combination of both.

A significant aspect is the placement of sensors that can monitor for each/all of temperature, pressure differential, airflow, and humidity. Sensors that monitor these different aspects are placed in different locations throughout the data center.

In particular, having temperature sensors inside the thermal shield 400 (preferably redundant ones at the two ends and the middle of the cluster at least), and at different levels (such as at the middle and top of a cabinet 110, as well as at the middle and top of the thermal shield 400), as well as in stratified locations in the gap between the ceiling 140 and the actual ceiling 150 (spaced at intervals of between 2-4 feet, as well as outside the thermal shield area, at the outside of cabinets in the cold aisles, allows for precise temperature gradient information throughout the facility.

Humidity sensors are helpful to have at locations that are the same as the temperature sensors, though fewer are needed, as humidity data need not be as precise for overall control of the building thermal environment.

Pressure differential sensors are also preferably located, redundantly, a number of different areas. These include within the thermal shield below the ceiling 140, outside the thermal shield below the ceiling 140, at different locations in the gap between the ceiling 140 and the actual ceiling 150 (spaced at intervals of between 2-4 feet), at various locations within the cold aisle ducts 310, particularly a header plenum that has a main cold air area to which many of the different condenser units connect, shown best along 310-1 in FIG. 5B2 and then distribute cool air to the cooling ducts 310 that form the cold aisles. This allows for sensing of the pressure at various locations, and in particular within the hot air containment chamber 210, outside the hot air containment chamber 210 above the cabinets 110, within the gap between the false ceiling and the actual ceiling 150, and within the cold aisle ducts. This allows for modification of the air handing units 800/900 by the control system 1100. Overall pressure control between the hot air containment chamber 210, the cold aisle, and the gap between the ceiling 140 and the actual ceiling 150 is achieved by adjusting the air handling units 800/900 so that the pressure is maintained in these different areas within a predetermined range of each other, for example. This also allows for running the facility at a positive pressure differential when outside air is used, at ranges of 1% to 6%, such that as in essence the building breathes out.

Airflow sensors are also preferably located in each of the areas where the pressure differential sensors are noted as being required, in order to ensure that the airflow is stable, as amounts of airflow that are too great, just as pressure differentials that are too great, can adversely affect the electronic equipment.

Areas where these differentials occur the most in the embodiments described herein are at the barrier caused by the thermal shield 400 within each cabinet cluster 590, between the ceiling 140 and the gap thereover, since heated air from each of the different hot aisle areas 210, associated with each cabinet cluster 590, vent to this large gap area.

Signals from these sensors, as shown by Temperature, Pressure Differential, Airflow, and Humidity Sensor Control and input/output (I/O) signals block 1310 can then be used to provide damper actuator control 1320, VFD fan control and I/O signals 1330, evaporator control and I/O signals 1340, condenser control and I/O signals 1350, evaporator control and I/O signals 1360, and optionally chiller control and I/O signals 1370. Within the Damper actuator control block is included the dampers associated with the cold aisle ducts, which dampers can be automatically adjusted to fully open, fully closed, or in-between amounts based upon sensing of the current conditions, as described previously.

Still furthermore, the AHU/PCS computer 1100 also monitors power consumption and power production, depending on the devices, to assess overall power usage. As such, electrical energy monitor sensors within the RPP 180 are operated upon by the RPP control and I/O signals block 1410 and provide an indication of the power usage of the electronics devices in the cabinets 110. The PDU 598 is monitored, as is known, and operated upon by the PDU control and I/O signals block 1420. Power load control and I/O signals block 1430 provides monitoring of the transformers and uninterruptable power supplies within the distribution area 584. Backup generator control and I/O signals block 1440 is used for the control of the backup generator 594, whereas telecommunication control and I/O signals block 1450 is used for the control of the telecommunications equipment. Equipment load control and I/O signals block 1460 controls and monitors energy consumption of other equipment within the data center facility The above control blocks can contain software written to both act upon input signals obtained from other sensors or other units and ensure that the various different units operate together. The usage of the term I/O signals is intended to convey that for any of the associated sensors, actuators for dampers, VFD for fans, and other mechanisms, that depending on the model used, such devices may output signals, input signals or both.

It is also noted that what occurs with one device will alter which other devices operate. Thus, for example malfunction of a particular circuit in an RPP 180 will cause the AHU/PCS computer 1100 to switch over to the redundant circuit in the same RPP 180 until that circuit is fixed.

Figure 1C:
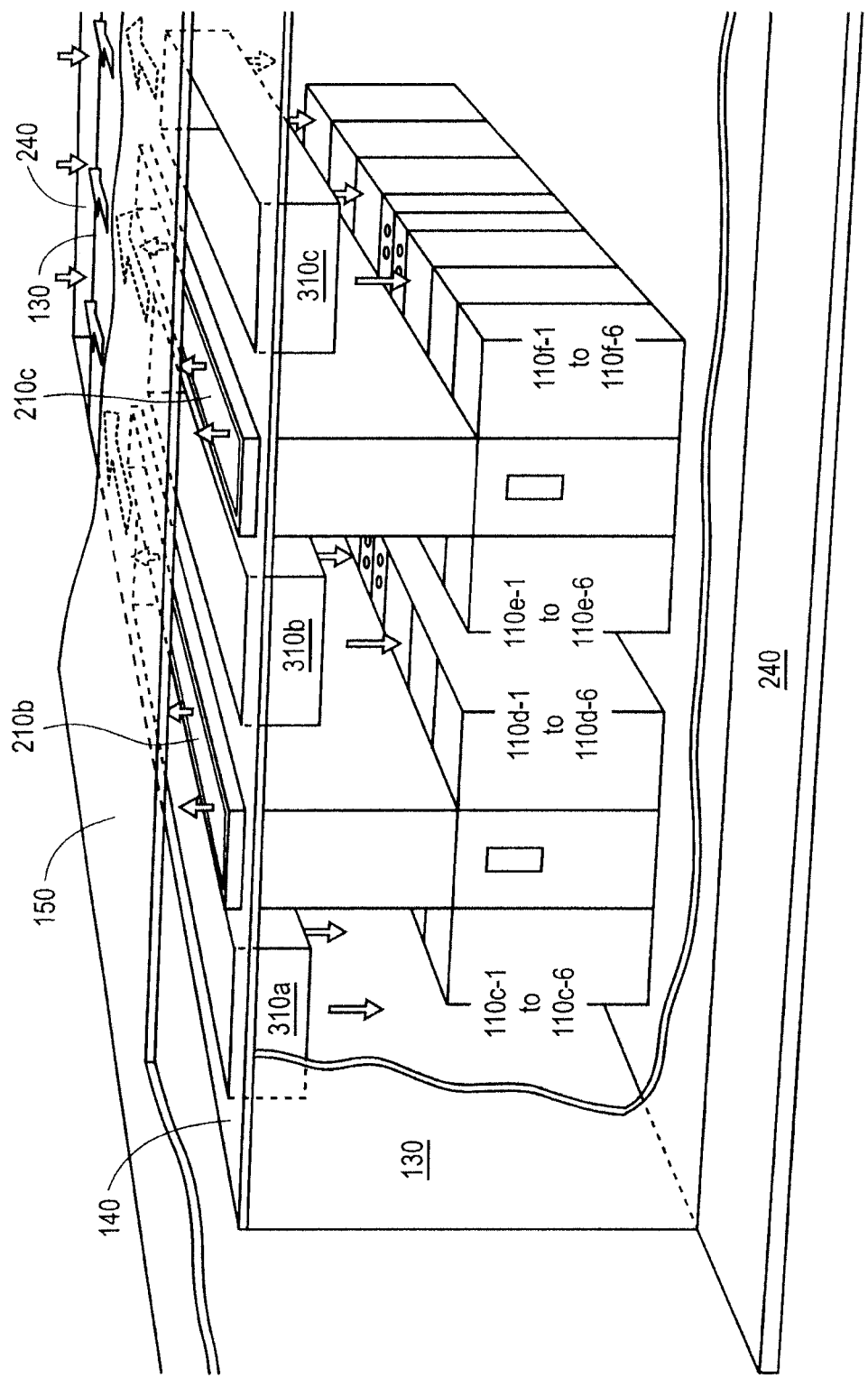
FIG. 1C illustrates a perspective cut-away view along line c-c from FIG. 1(a) of FIG. 1(a).

It is particularly noted that the above system can monitor and control for certain situations that are particularly significant for data centers. For example, the air flow patterns that are caused, with the inclusion of the ceiling 140 as shown in FIG. 1C, require assessment of high and low pressure areas. The AHU/PCS computer 1100 can monitor for this, and as a result maintain a balance, thus ensuring that equipment fan modules (i.e., the fans, motors and/or controls associated therewith) and other components that are within the electronics equipment stored in the cabinets 110 are not damaged.

Also shown in FIG. 10 are building cabinet cluster and cage lock sensors block 1510. This allows for the detection of which cabinet clusters 590, as well as which cabinets 110, are open, based upon sensors that are placed at each of these areas.

Fire and roof water detection leak sensors module 1520 is also shown, as this can be used in conjunction with known systems, and interfaced with the other blocks referred to herein, to ensure that if a fire or leak is detected, that appropriate shut down of equipment in the preferred sequence to avoid damage is done.

Uninterruptable Cooling Fan with Weighted Rotor

In case of power outage, it is important to be able to continue cooling the data center, and back-up generators are provided for this purpose. However, there is typically a period of approximately 15 seconds between the power going down and the back-up generators coming online. To provide continuous power to critical components of the data center, such as the air handling system, during this interim time period uninterruptable power supplies may be provided on-site within distribution area 584 as shown in FIG. 5A and described above. However, due to the high cost of providing uninterruptible power supplies with sufficient energy storage capacity to run the HVAC system, alternative embodiments of the air handling system have been configured which can keep operating during the interim time period with no dependence on the uninterruptible power supplies.

A cost effective and convenient approach to keeping the air handling system operational during the time interval between loss of grid power and back-up power being on-line may include deploying uninterruptable cooling fans with weighted rotors throughout the air handling system, particularly as noted herein, in order to avoid needing to have as many uninterruptable power supplies for the HVAC system throughout the data center in order to ensure that the fans and other components within the electronics equipment stored in the cabinets 110 isn't damaged. A concept of the embodiments is to keep the air moving through the air handling system by storing sufficient energy in the fan rotors in order to provide sufficient cooling (air flow above a critical level) to the electronics equipment cabinets to avoid deleterious thermal events as well as damage to the electronic equipment, such as the equipment fan module, and thereby remove the need for an uninterruptable power supply within each HVAC system that is otherwise needed to power equipment fan modules. This is achieved by adding sufficient weight to fan rotors to store the energy needed for the fans to keep the air flow above the critical level for an interim time period until the back-up generators come on-line and electrical power is once again supplied to the fan motors. All or some of the fans 870 in the air cooling area (see FIGS. 9D and 9E) may be replaced with the uninterruptable cooling fans described herein in order to provide the back-up cooling described herein. During the interim period between loss of grid power and back-up generators coming on-line, the condenser unit 800 has sufficient cooling capacity for the uninterruptable fans to circulate cool air out to the electronics equipment cabinets, though the condenser unit 800 itself will have lost power and be turned off. Some or all of the exhaust fans 910 (see FIG. 9C) may be replaced with the uninterruptable cooling fans as described herein in order to provide the back-up cooling described herein. Furthermore, some or all of both fans 910 and 870 may be replaced with the uninterruptable cooling fans of the present invention. Depending on the number of fans replaced, the specifications of the uninterruptable cooling fans will be set to handle the required air flows.

The uninterruptible cooling fans with weighted rotors are designed to keep spinning and spinning with enough angular velocity to provide a good air flow for the entire interim time period of approximately 20 seconds. The use of such a fan that keeps spinning and moving the air is contrary to the norm in heating and air conditioning systems in which fans are designed to stop spinning very rapidly, since in a conventional system one wants to maintain the temperature that is set by a thermostat; since the air conditioning coils are still cold, once the action temperature is decreased to a desired temperature, fan blades are turned off and stop spinning quickly so that the actual temperatures is the desired temperature; if the fans were to keep spinning and continuing to blow cold air, the desired temperature would not be achieved, but a temperature lower than that which was desired.

FIGS. 11A and 11B show perspective and side views, respectively, of an example of an uninterruptable cooling fan 1600. In one embodiment, the cooling fan 1600 has a fan rotor assembly including a fan body 1610 with multiple fan blades 1615, a flywheel 1620 and a shaft 1630. The fan body and flywheel are attached to the shaft 1630 which is driven by an electric motor 1640. The axis of rotation for the entire fan rotor assembly is indicated by dashed line 1635. The fan shown in FIGS. 11A and 11B is a centrifugal fan, also commonly known as a squirrel cage fan or blower and is suitable for integration with Fanwall Technology®. However, other fan types may be used, which may or may not use a flywheel, according to the teaching and principles described herein to achieve the desired continuous cooling during a power outage.

Energy is stored in the fan rotor assembly (significant weight being preferably placed both in the perimeter of the flywheel as well as the rotor blades) as rotational energy and when grid power is cut the rotors are decelerated by the air resistance of the fan blades which push the air through the air handling system. Energy loss due to friction at the rotor bearings must also be accounted for but is generally small compared with the air resistance of the moving fan blades. There must be sufficient energy stored in the fan rotor assembly to keep the air flow above the critical level so as to provide sufficient cooling to the electronics equipment cabinets for the entire interim time period between loss of grid power and back-up generators coming online, which may typically be between 10 and 25 seconds, or approximately 20 seconds. The rotational energy stored in the fan rotor is given by:

$$E_{rotational} = (1/2) I \omega^2 \qquad (1)$$

where I is the moment of inertia of the rotor and ω is the angular speed of the rotor. The airflow (typically measured in cubic feet per minute, cfm) provided by a fan is proportional to the angular speed of the fan rotor. Thus, knowing the typical operating airflow and the critical airflow required to protect the electronics equipment allows the values for the rotor angular speed at the beginning of the power outage and the minimum at the end of the interim period to be calculated. The energy lost by the rotor during the interim period can be calculated from calibration charts for the fan which include plots of power against airflow. Knowing the beginning and minimum ending angular speeds and the total energy lost by the rotor during the interim period allows for calculation of the minimum moment of inertia that will be required for the fan rotor. The desired inertia of the rotor will typically be the calculated to maintain 100% CFM of the data center space for the duration of outage, which is dependent on (1) the backup generator being used and time it takes from its startup to achieve 100% load; (2) the size of the room (which indicates the amount of standing cold air; and (3) the CFM being consumed with the first of these factors being most prevalent. Using just the first factor, for example, if a particular backup generator turns on at 11 seconds but requires 20 seconds to reach appropriate voltage and frequency to accept full load, this requires that the rotor continue to spin at a 100% rated amount for 20 seconds (without taking into consideration factors (2) and (3)), which will always decrease the time needed to spin at the 100% rated amount. Once the desired moment of inertia is known, suitable modifications to the rotor can be made—adding weight in various places to provide the desired moment of inertia. For example, a disk may be attached to the fan as shown in FIGS. 11A and 11B. The disc may have a uniform weight distribution or may be more heavily weighted at the disk circumference, for example. Alternatively, weight may be added to the outer circumference of the squirrel cage rotor, etc.

Figure 12B:
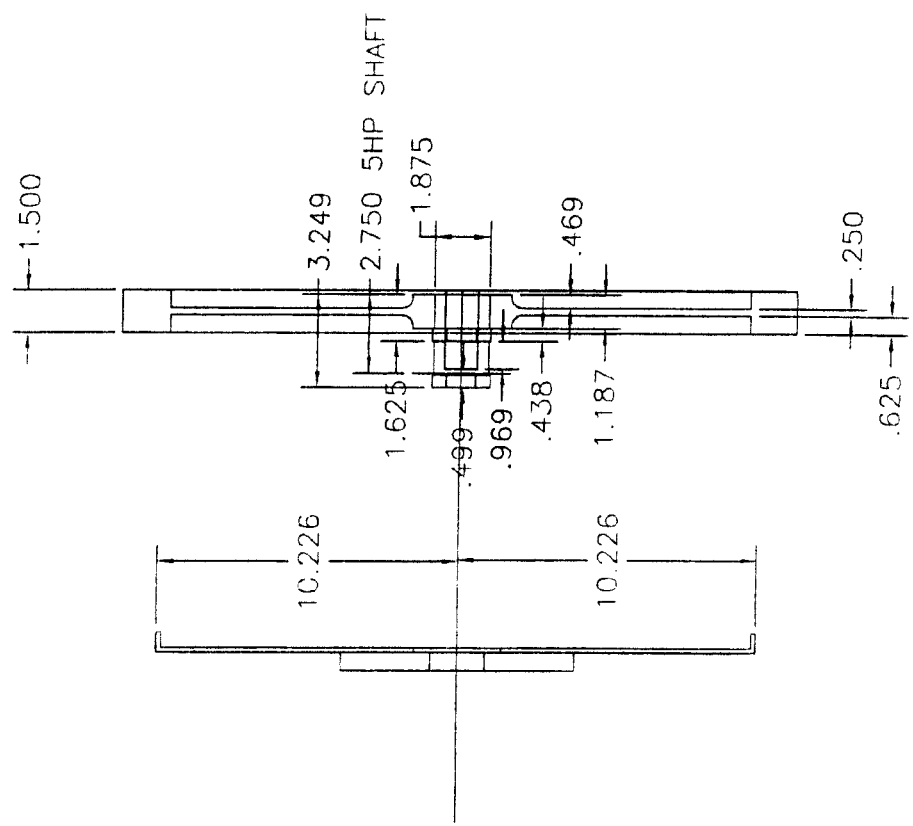
FIGS. 12A(1), 12A(2), and 12B illustrate a preferred embodiment of a flywheel.

In a particular embodiment, a fanwheel as illustrated in FIG. 11, along with a flywheel, will provide sufficient moment of inertia to maintain the air movement required. FIGS. 12A(1), 12A(2) and 12B illustrate a preferred embodiment of the flywheel 1620 illustrated in FIGS. 11A and 11B, usable along with a fanwheel that has a 20" diameter, and 85% width, and in conjunction in a preferred embodiment with a 7.5 HP motor and a 7.5 HP ABB ACH VFD, the flywheel being noted as flywheel 1 620A. Flywheel 1 620A is a 23" flywheel, weighs approximately 60-100 pounds, and creates a mass moment of inertia of approximately 6,000 lbs-In$^2$. It is noted that the central mass section 1620A-10 has a reduced width to keep the overall mass of the flywheel to a minimum to preserve motor life, and the outer full width ring portion 1620A-20 contains majority of the mass moment of inertia of the flywheel.

Figure 13B:
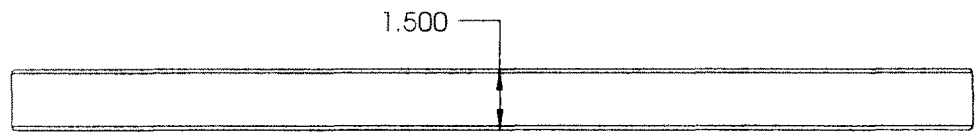
FIGS. 13A, and 13B illustrate another preferred embodiment of a flywheel.
Figure 13A:
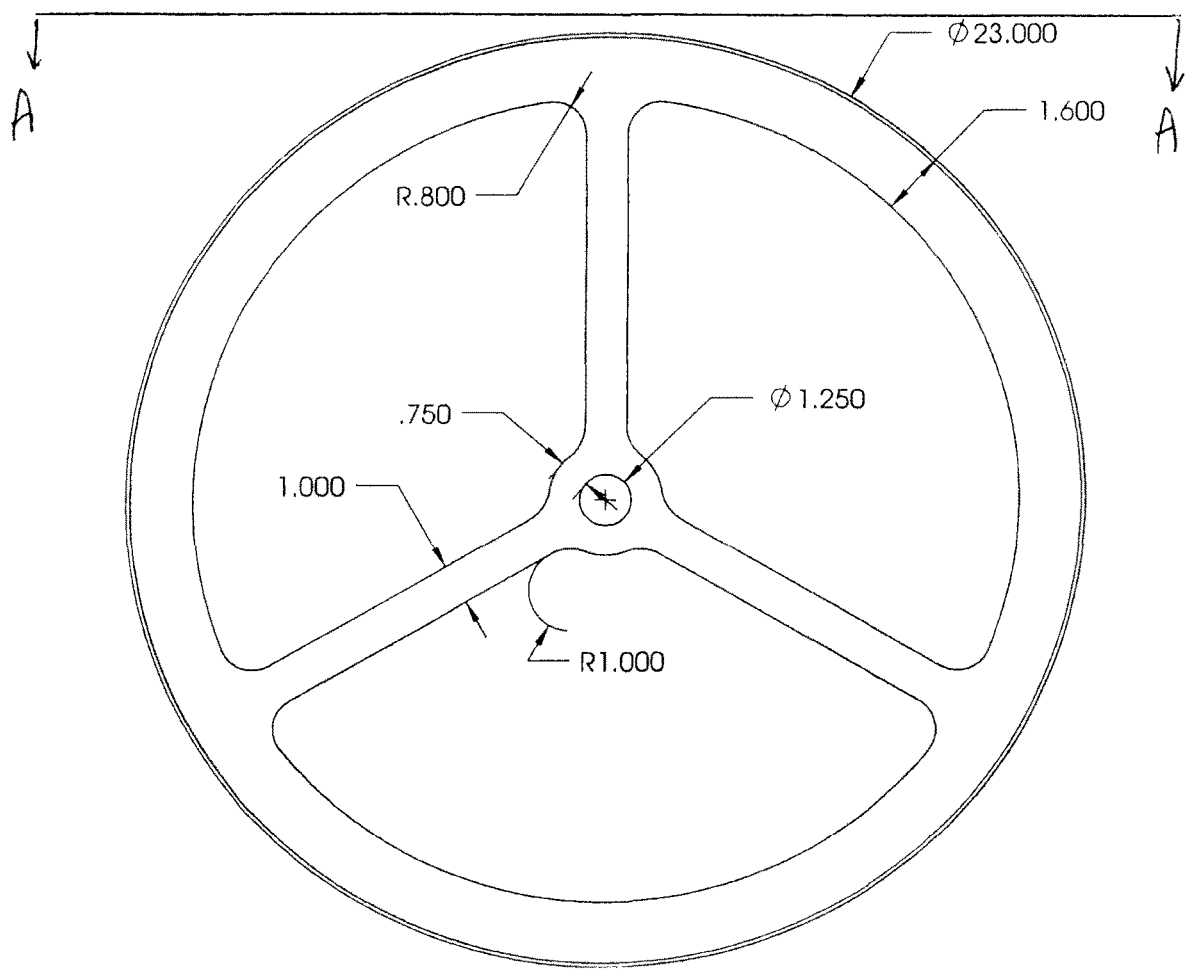

FIGS. 13A and 13B illustrate another preferred embodiment of a flywheel, noted as 1620B, which contains spokes 1620B-10 rather than a central portion 1620A-10 as referred to previously. The weight of this flywheel, about 80 pounds and provides about the same mass moment of inertia as the FIGS. 12A(1) 12A(2) and 12B flywheel described above.

In light of the above different flywheel embodiments, a weighted rotor assembly that weighs in the range of 50-120 pounds, and preferably in the range of 60-80 pounds, can be configured to provide the sufficient moment of inertia.

Furthermore, the uninterruptable cooling fans may be configured for generation of electricity during a power outage in order to keep a control system for the air handling unit powered until back-up generators come on-line. Thus, the power generated by the fans as described herein can be used to power parts of the control system 1701 (in particular in a reduced power mode to ensure proper turn off sequencing of various equipment) and/or the VFD circuits 1702. Maintaining the VFD circuits in an always-on state, without turning off due to lack of power being supplied thereto, has a particular advantage in that the VFD circuits then don't need to be reset. As described above energy is stored in the fan rotors which may be used to continue moving air through the air handling system during a power outage. Some of this stored energy may also be used to generate electricity for continuous operation of the air handling control system, including variable frequency drives for the cooling fans themselves, should VFD be used. The necessary voltage may be generated by the fan rotors back-driving the fan motors to which they are coupled. The fan motors must be adapted for this purpose using a solenoid 1703 and control module 1704 associated therewith. Note that keeping the control circuitry of the VFD powered during the interim time period is required if the fan motors are to go back on-line immediately on the back-up generators coming on-line—if the VFD loses power then it may have to go through a start-up sequence before power is provided to the fan motors, as noted above, which further increases the time that the fans motors are not powered.

Although the embodiments have been particularly described, it should be readily apparent to those of ordinary skill in the art that various changes, modifications, and substitutes are intended within the form and details thereof, without departing from their spirit and scope. Accordingly, it will be appreciated that in numerous instances some features will be employed without a corresponding use of other features. Further, those skilled in the art will understand that variations can be made in the number and arrangement of components illustrated in the above figures.

What is claimed is:

1. A method of preventing damage to electrical equipment, the electrical equipment being cooled with cool air from an electrically powered air conditioning unit during normal operation using grid power, the method comprising the steps of:
   rotating a fan to a predetermined RPM using an electric motor powered with electricity from the grid power to cause at least a predetermined airflow, the fan including a weighted rotor assembly that includes a fan body and a plurality of fan blades, wherein the weighted rotor assembly weighs at least fifty pounds to create stored angular kinetic energy;
   directing the airflow to the electrical equipment;
   upon removal of the grid power to the fan, continuing to direct continued airflow to the electrical equipment for at least an interim period using the stored angular kinetic energy within the fan; and
   before expiration of the interim period, continuing to rotate the fan using the electric motor powered with electricity from a back-up generator to cause a predetermined further continued airflow to the electrical equipment;
   determining beginning and minimum ending angular speeds of the rotor assembly, as well as total energy lost by the rotor assembly during the interim period therebetween;
   calculating a minimum mass moment of inertia of the rotor assembly based on the beginning and minimum ending angular speeds of the rotor assembly, as well as the total energy lost,
   wherein said interim period is between 10 and 25 seconds, and the minimum mass moment of inertia of the rotor assembly is at least 6,000 lbs-in$^2$.

2. The method according to claim 1 wherein said weighted rotor assembly includes a flywheel.

3. The method according to claim 2 wherein the fan is a centrifugal fan.

4. The method according to claim 1 wherein said fan is an array of fans, each fan in the array being configured with the weighted rotor assembly.

5. The method according to claim 1 wherein the step of rotating the fan includes controlling the fan using a control system; and further including the step of using the stored angular kinetic energy to generate electricity to power said control system in a reduced power mode for the interim period.

6. The method according to claim 1 wherein the electric motor used in the step of using the electric motor powered with electricity from the grid power is a variable frequency drive motor; and further including the step of using the stored angular kinetic energy to generate electricity to power said variable frequency drive motor in a reduced power mode for the interim period.

7. The method according to claim 1 wherein the airflow is directed through a venting system to the electrical equipment.

8. The method according to claim 1 further comprising attaching a weight to an outer circumference of the rotor assembly.

9. The method according to claim 1 wherein the weighted rotor assembly further includes a disk attached to the fan body, and wherein the disk has a distribution wherein the disk is more heavily weighted at a circumference of the disk.

10. The method according to claim 1, wherein weights is positioned in both the perimeter of the flywheel and the rotor blades of the fan.

11. A method preventing damage to electrical equipment, the electrical equipment being cooled with cool air from an electrically powered air conditioning unit during normal operation using grid power, the method comprising the steps of:

rotating a fan to a predetermined RPM using an electric motor powered with electricity from the grid power to cause at least a predetermined airflow, the fan including a weighted rotor assembly that includes a fan body and a plurality of fan blades, wherein the weighted rotor assembly is configured to create stored angular kinetic energy;

directing the airflow to the electrical equipment;

upon removal of the grid power to the fan, continuing to direct continued airflow to the electrical equipment for at least an interim period using the stored angular kinetic energy within the fan;

determining beginning and minimum ending angular speeds of the rotor assembly, as well as total energy lost by the rotor assembly during the interim period therebetween; and calculating a minimum mass moment of inertia of the rotor assembly based on the beginning and minimum ending angular speeds of the rotor assembly, as well as the total energy lost;

wherein said interim period is between 10 and 25 seconds and a minimum mass moment of inertia of the rotor assembly is at least 6,000 lbs-in$^2$.

12. The method according to claim 11 further comprising, before expiration of the interim period, continuing to rotate the fan using the electric motor powered with electricity from a back-up generator to cause a predetermined further continued airflow to the electrical equipment.

13. The method according to claim 12 wherein the weighted rotor assembly weighs at least fifty pounds.

14. The method according to claim 11 wherein said weighted rotor assembly includes a flywheel.

15. The method according to claim 14 wherein the fan is a centrifugal fan.

16. The method according to claim 11 wherein said fan is an array of fans, each fan in the array being configured with the weighted rotor assembly.

17. The method according to claim 11 wherein the step of rotating the fan includes controlling the fan using a control system; and further including the step of using the stored angular kinetic energy to generate electricity to power said control system in a reduced power mode for the interim period.

18. The method according the claim 11 wherein the electric motor used in the step of using the electric motor powered with electricity from the grid power is a variable frequency drive motor; and further including the step of using the stored angular kinetic energy to generate electricity to power said variable frequency drive motor in a reduced power mode for the interim period.

19. The method according to claim 11, further comprising attaching a weight to an outer circumference of the rotor assembly.

20. The method according to claim 11, wherein weights is positioned in both the perimeter of the flywheel and the rotor blades of the fan.

* * * * *